(12) United States Patent
Murayama et al.

(10) Patent No.: US 10,727,144 B2
(45) Date of Patent: Jul. 28, 2020

(54) LIGHT EMITTING APPARATUS AND METHOD OF MANUFACTURING LIGHT EMITTING APPARATUS

(71) Applicant: SONY CORPORATION, Tokyo (JP)

(72) Inventors: Masahiro Murayama, Miyagi (JP); Yuji Furushima, Miyagi (JP)

(73) Assignee: SNY CORPORATION, Tokyo (JP)

( * ) Notice: Subject to any disclaimer, the term of this patent is extended or adjusted under 35 U.S.C. 154(b) by 0 days.

(21) Appl. No.: 16/077,681

(22) PCT Filed: Nov. 25, 2016

(86) PCT No.: PCT/JP2016/004968
§ 371 (c)(1),
(2) Date: Aug. 13, 2018

(87) PCT Pub. No.: WO2017/149573
PCT Pub. Date: Sep. 8, 2017

(65) Prior Publication Data
US 2019/0035700 A1 Jan. 31, 2019

(30) Foreign Application Priority Data
Mar. 2, 2016 (JP) .................. 2016-039646

(51) Int. Cl.
*H01L 23/02* (2006.01)
*H01S 5/022* (2006.01)
*H01L 23/00* (2006.01)

(52) U.S. Cl.
CPC .............. *H01L 23/02* (2013.01); *H01L 24/44* (2013.01); *H01S 5/022* (2013.01);
(Continued)

(58) Field of Classification Search
CPC ..................... H01L 23/02; H01L 24/44; H01L 2224/48091; H01L 2224/97; H01S 5/022;
(Continued)

(56) References Cited

U.S. PATENT DOCUMENTS 4,953,006 A * 8/1990 Kovats ................. G02B 6/4204
257/680
4,989,930 A 2/1991 Nakagawa et al.
(Continued)

FOREIGN PATENT DOCUMENTS

CN 101593932 A 12/2009
DE 3902579 A1 8/1989
(Continued)

OTHER PUBLICATIONS

International Search Report and Written Opinion of PCT Application No. PCT/JP2016/004968, dated Jan. 24, 2017, 09 pages of ISRWO.

*Primary Examiner* — Fernando L Toledo
*Assistant Examiner* — Neil R Prasad
(74) *Attorney, Agent, or Firm* — Chip Law Group

(57) ABSTRACT

A light emitting apparatus according to an embodiment of the present technology includes a base portion, a light emitting element, and a cover portion. The base portion includes a support surface. The light emitting element is disposed on the support surface of the base portion. The cover portion includes a light transmission portion through which light emitted from the light emitting element is transmitted and a protrusion portion which is provided on at least a part of a periphery of the light transmission portion and protruded relative to the light transmission portion, the cover portion being provided on the support surface in such a manner as to cover the light emitting element.

14 Claims, 16 Drawing Sheets

(52) U.S. Cl.
CPC .............................. *H01S 5/02208* (2013.01); *H01L 2224/48091* (2013.01); *H01L 2224/97* (2013.01); *H01S 5/02276* (2013.01); *H01S 5/02296* (2013.01)

(58) Field of Classification Search
CPC ............. H01S 5/02208; H01S 5/02276; H01S 5/02296
See application file for complete search history.

(56) References Cited

U.S. PATENT DOCUMENTS

| 2004/0184744 | A1 | 9/2004 | Uekawa | |
| 2006/0251362 | A1 | 11/2006 | Uekawa | |
| 2008/0086173 | A1* | 4/2008 | Ok | A61F 15/001 607/2 |
| 2009/0294789 | A1 | 12/2009 | Yoshida | |
| 2017/0359556 | A1* | 12/2017 | Yoshimura | H01S 5/022 |

FOREIGN PATENT DOCUMENTS

| JP | 01-192188 A | 8/1989 |
| JP | 2001-257410 A | 9/2001 |
| JP | 2005-156687 A | 6/2005 |
| JP | 2009-289775 A | 12/2009 |
| JP | 2012-164924 A | 8/2012 |
| JP | 2015-014803 A | 1/2015 |
| NL | 8900202 A | 8/1989 |

* cited by examiner

FIG. 1A
FIG. 1B
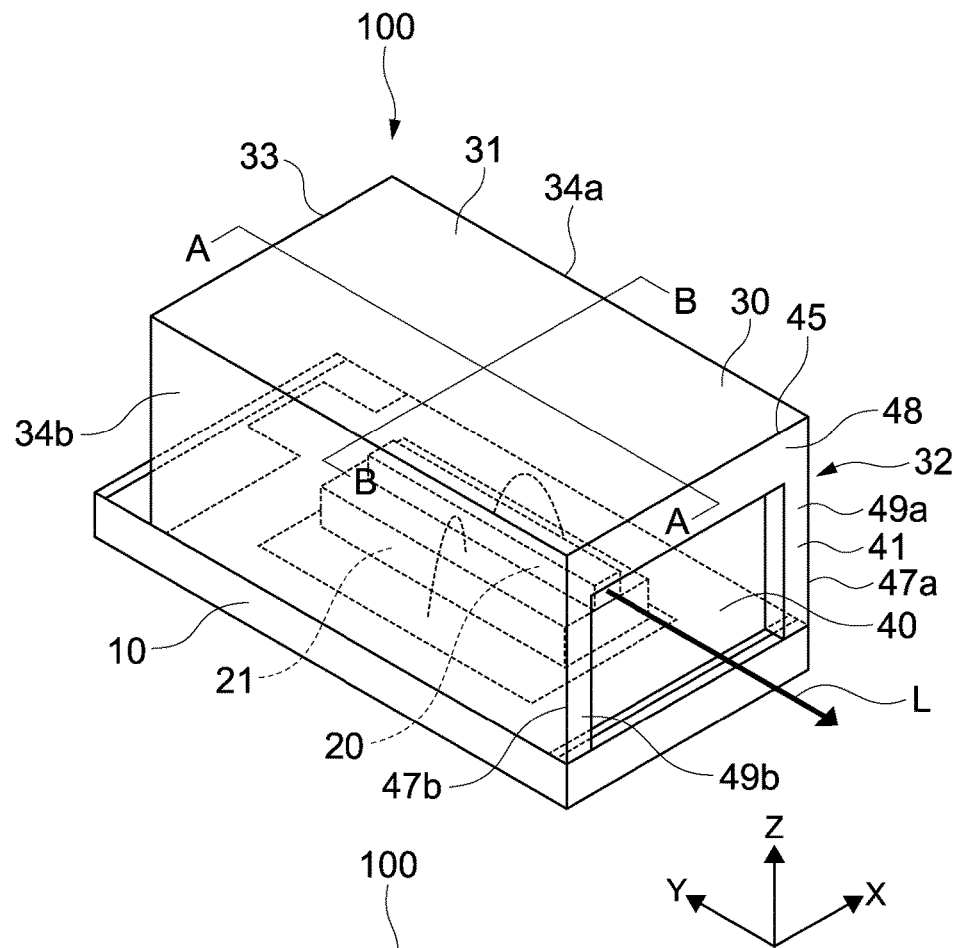
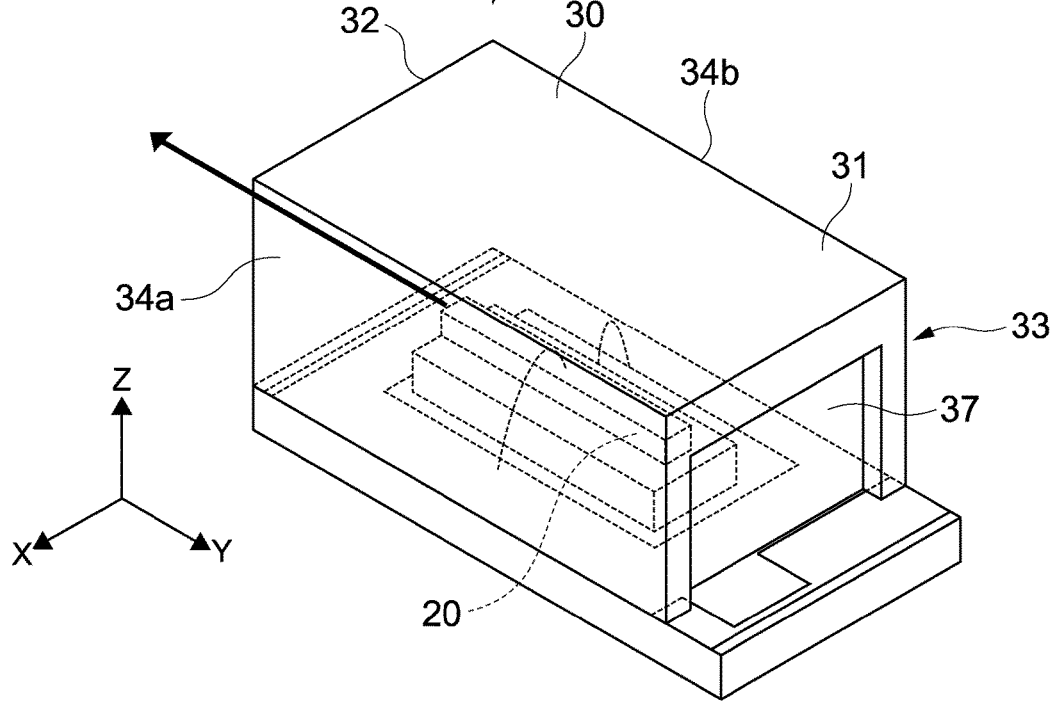

LIGHT EMITTING APPARATUS AND METHOD OF MANUFACTURING LIGHT EMITTING APPARATUS

CROSS REFERENCE TO RELATED APPLICATIONS

This application is a U.S. National Phase of International Patent Application No. PCT/JP2016/004968 filed on Nov. 25, 2016, which claims priority benefit of Japanese Patent Application No. JP 2016-039646 filed in the Japan Patent Office on Mar. 2, 2016. Each of the above-referenced applications is hereby incorporated herein by reference in its entirety.

TECHNICAL FIELD

The present technology relates to a light emitting apparatus having a light emitting element such as a semiconductor laser, and a method of manufacturing a light emitting apparatus.

BACKGROUND ART

In related art, as a light emitting apparatus provided with a semiconductor laser, a packaged light emitting apparatus such as a can package and a frame package is widely used. For example, in a light emitting apparatus described in Patent Literature 1, a semiconductor laser is mounted on a first substrate in a laid posture. A second substrate having a depressed portion that forms a sealed space is connected with the first substrate so as to cover the semiconductor laser. The second substrate has cleavage, and a front end surface thereof is a cleavage surface. On the front end surface, a light guide hole for guiding light from the semiconductor laser to outside is formed. In addition, to the front end surface, a light extraction window made of a transparent glass plate is attached. With this configuration, package downsizing and high airtightness are achieved (paragraphs [0028] and the like in description of Patent Literature 1).

CITATION LIST

Patent Literature

Patent Literature 1: Japanese Patent Application Laid-open No. 2009-289775

DISCLOSURE OF INVENTION

Technical Problem

In the light emitting apparatus as described above, a technology capable of suppressing an occurrence of a failure at a time of handling the light emitting apparatus, for example, at a time of conveying or mounting onto various apparatuses is demanded. Further, it is also important that the light emitting apparatus as described above can be manufactured with high productivity.

In view of the circumstances as described above, an object of the present technology is to provide a light emitting apparatus capable of suppressing an occurrence of a failure at a time of handling and a method of manufacturing the light emitting apparatus.

Solution to Problem

To achieve the object described above, a light emitting apparatus according to an embodiment of the present technology includes a base portion, a light emitting element, and a cover portion.

The base portion includes a support surface.

The light emitting element is provided on the support surface of the base portion.

The cover portion includes a light transmission portion through which light emitted from the light emitting element is transmitted and a protrusion portion which is provided on at least a part of a periphery of the light transmission portion and protruded relative to the light transmission portion, and the cover portion is provided on the support surface in such a manner as to cover the light emitting element.

In the light emitting apparatus, the protrusion portion is provided on the periphery of the light transmission portion through which light from the light emitting element is transmitted. Because the protrusion portion protects the light transmission portion, it is possible to suppress an occurrence of a failure at a time of handling.

The protrusion portion may be protruded along a direction of transmission of light emitted from the light emitting element.

As a result, it is possible to sufficiently protect the light transmission portion.

The cover portion may include a plurality of side surface portions which surrounds the light emitting element. In this case, the light transmission portion and the protrusion portion may be provided on a first side surface portion out of the plurality of side surface portions.

For example, in a case where an edge-emitting laser element is used as a light emitting element, it is possible to sufficiently suppress an occurrence of a failure at a time of handling.

The first side surface portion may include a lower side connected with the support surface and an upper side opposite thereto. In this case, the protrusion portion may be provided on an upper side area adjacent to at least the upper side.

As a result, it is possible to provide the light transmission portion on a center of the side surface portion, and the protrusion portion provided thereabove can sufficiently protect the light transmission portion.

The first side surface portion may include two lateral sides disposed between the lower side and the upper side. In this case, the protrusion portion may be disposed on two lateral side areas adjacent to the upper side area and the two lateral sides.

As a result, for example, the light transmission portion provided on a center of the side surface portion can be sufficiently protected by the protrusion portions disposed on upper, left, and right sides thereof.

The cover portion may include an upper surface portion which faces the support surface. In this case, the protrusion portion may include an end portion of the upper surface portion on the first side surface portion side, the end portion being protruded relative to the light transmission surface.

The upper surface portion is protruded relative to the light transmission surface, with the result that the protrusion portion can be easily provided.

The cover portion may include two second side surface portions connected with the first side surface portion. In this case, the protrusion portion may include end portions of the two second side surface portions on the first side surface portion side, the end portions being protruded relative to the light transmission surface.

The two second side surface portions are protruded relative to the light transmission surface, with the result that the protrusion portion can be easily provided.

The cover portion may be entirely made of a same material integrally.

As a result, it is possible to omit an assembly step of the cover portion or the like, and thus it is possible to simplify a manufacturing process of the light emitting apparatus.

The cover portion may be made of glass or sapphire.

As a result, it is possible to efficiently take light from light emitting element.

The light transmission portion and the protrusion portion may be made of materials different from each other.

As a result, it is possible to suppress material cost or the like.

The first side surface portion may include a through hole, a peripheral portion of the through hole, and a light transmission side member which includes the light transmission portion and is connected to the peripheral portion from an inner portion side of the cover portion in such a manner that the light transmission portion blocks the through hole from the inner portion side.

As a result, it is possible to cause the peripheral portion of the through hole to be protruded relative to the light transmission portion of the light transmission side member. That is, the peripheral portion can constitute the protrusion portion. The light transmission side member is a member separated from a remaining part of the cover portion, with the result that manufacturing process can be simplified, and the material cost can be suppressed, for example.

The cover portion may include an upper surface portion which faces the support surface. In this case, the first side surface portion may have a part connected with the upper surface portion, a cross sectional area of which is larger than a cross sectional area of a part connected with the support surface.

As a result, it is possible to enhance an intensity of the cover portion.

The cross sectional area of the first side surface portion may be increased from the part connected with the support surface toward the part connected with the upper surface portion.

As a result, it is possible to enhance an intensity of the cover portion.

The light emitting apparatus according to claim 12, wherein the first side surface portion has the part connected with the upper surface portion which has a curved shape.

As a result, it is possible to enhance an intensity of the cover portion.

To achieve the object described above, according to another embodiment of the present technology, a method of manufacturing a light emitting apparatus includes mounting a plurality of light emitting elements on a substrate.

On a main surface portion of a cover member, at least one light transmission side member including a light transmission portion through which light emitted from each of the plurality of light emitting elements is transmitted is formed in accordance with positions of the plurality of light emitting element.

The substrate and the cover member are bonded in such a manner that the light transmission side member is connected with a predetermined position with respect to the plurality of light emitting elements on the substrate.

A position which is offset toward a direction in which the light is transmitted relative to the light transmission portion of the light transmission side member on the main surface portion is cut, thereby forming a plurality of light emitting apparatuses including the plurality of light emitting elements.

As a result, it is possible to manufacture a light emitting apparatus having the protrusion portion protruded in a light transmission direction relative to the light transmission portion with good productivity.

The step of forming the light transmission side member may include forming the main surface portion and the light transmission side member integrally by a same material.

As a result, it is possible to simplify the manufacturing process.

The step of forming the light transmission side member may include connecting the light transmission side member separated from the main surface portion with the main surface portion.

As a result, for example, it is possible to suppress material cost or the like.

Advantageous Effects of Invention

As described above, according to the present technology, it is possible to suppress an occurrence of a failure at a time of handling. It should be noted that the effects described herein are not necessarily limited, any effect described in the present disclosure may be obtained.

BRIEF DESCRIPTION OF DRAWINGS

FIGS. 1A and 1B Perspective views schematically showing a configuration example of a light emitting apparatus according to a first embodiment.

MODE(S) FOR CARRYING OUT THE INVENTION

Hereinafter, embodiments of the present technology will be described with reference to the drawings.

First Embodiment

[Configuration of Light Emitting Apparatus]

Figure 2:
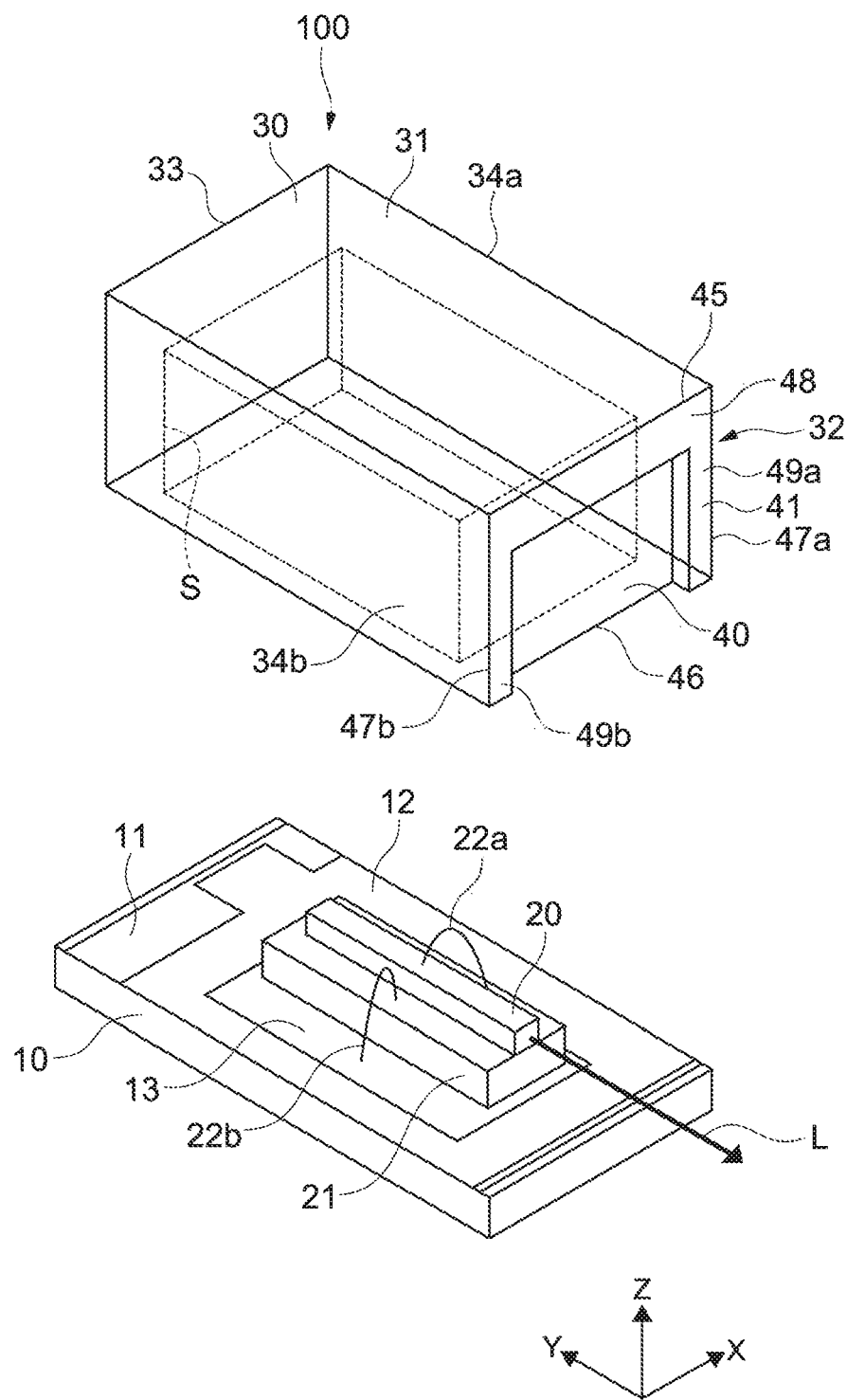
FIG. 2 A diagram showing a state in which a glass cap shown in FIGS. 1A and 1B is detached.

FIGS. 1A and 1B are perspective views schematically showing a configuration example of a light emitting apparatus 100 according to a first embodiment of the present technology. FIG. 2 is a diagram showing a state in which a glass cap 30 shown in FIGS. 1A and 1B is detached. In FIGS. 1A and 1B, a part overlapped with the glass cap 30 is indicated with broken lines. In FIG. 2, an inside space S of the glass cap 30 is indicated with broken lines. Further, in FIG. 2, for ease of understanding the figure, a configuration of a back surface portion 33 of the glass cap 30 is simplified. Further, in FIG. 2, for ease of understanding the figure, a configuration of a back surface portion 33 of the glass cap 30 is simplified.

The light emitting apparatus 100 includes a base substrate 10, a semiconductor laser 20, and a glass cap 30. The base substrate 10 is made of a plate-like member having a substantially long, flat shape, and is made of ceramics or metal, for example. As shown in FIG. 2, on a support surface 11 of the base substrate 10, a first electrode 12 and a second electrode 13 serving as an anode electrode and a cathode electrode are formed.

The semiconductor laser 20 is an edge-emitting laser element and is mounted on the second electrode 13 of the base substrate 10 through a sub mount 21. As shown in FIGS. 1A, 1B and 2, the semiconductor laser 20 is extended along a long-axis direction (Y direction) of the base substrate 10. Further, an emission direction of laser light L emitted from the semiconductor laser 20 is set to be along the Y direction. It should be noted that a material of the sub mount 21 is not limited.

As shown in FIG. 2, with a metal wire 22a, the first electrode 12 and the semiconductor laser 20 are connected. Further, with a wire 22b, the second electrode 13 and the semiconductor laser 20 are connected through the sub mount 21. When electric power is supplied to the first electrode 12 and the second electrode 13, the laser light L is emitted along the Y direction. A specific configuration of the semiconductor laser 20, a wavelength range of laser light to be emitted, and the like are not limited. Any edge-emitting laser element may be used therefor.

The glass cap 30 has an outline of a substantially rectangular parallelepiped shape and is bonded to the support surface 11 of the base substrate 10 so as to cover the semiconductor laser 20. By the inside space S of the glass cap 30, the semiconductor laser 20 is sealed with high airtightness. Hereinafter, the inside space S may be referred to as a sealed space S with a use of the same symbol S.

In this embodiment, the glass cap 30 corresponds to a cover portion. The cover portion may be made of a material different from the glass material, for example, sapphire. A use of glass or sapphire for the material of the cover portion enables the laser light L to be extracted efficiently. It should be noted that the material that constitutes the cover portion is not limited, and another material may be used.

As shown in FIGS. 1A 1B and 2, the glass cap 30 includes an upper surface portion 31, a front surface portion 32, a back surface portion 33, and two side surface portions 34a and 34b. The laser light L emitted from the semiconductor laser 20 is caused to pass through the front surface portion 32 and exit to outside of the light emitting apparatus 100.

It should be noted that a vertical positional relationship between the upper surface portion 31 and an upper side 45 and a lower side 46 to be described below is set with the support surface 11 of the base substrate 10 as a reference. That is, a side closer to the support surface 11 is set as a lower side, and a side farther therefrom is set as an upper side (Z direction corresponds to a vertical direction). Of course, in an actual use space, depending on an orientation in which the light emitting apparatus 100 is used, the upper surface portion 31 can be positioned to a lower side than the support surface 11, for example.

The upper surface portion 31, the front surface portion 32, the back surface portion 33, and the two side surface portions 34a and 34b each have a rectangular shape when viewed from a front surface. The front surface portion 32, the back surface portion 33, and the two side surface portions 34a and 34b correspond to a plurality of side surface portions in this embodiment. Further, the front surface portion 32 corresponds to a first side surface portion, and the two side surface portions 34a and 34b correspond to two second side surface portions.

Figure 3A:
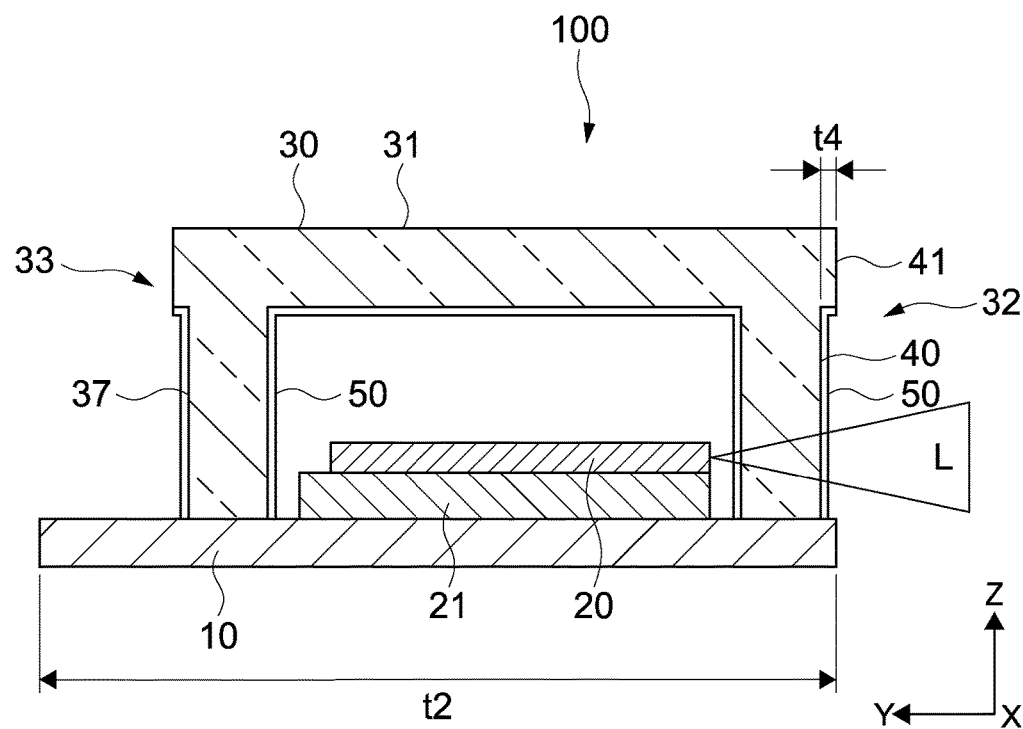
FIGS. 3A and 3B Cross-sectional views of the light emitting apparatus taken along a line A-A and a line B-B of FIGS. 1A and 1B.
Figure 3B:
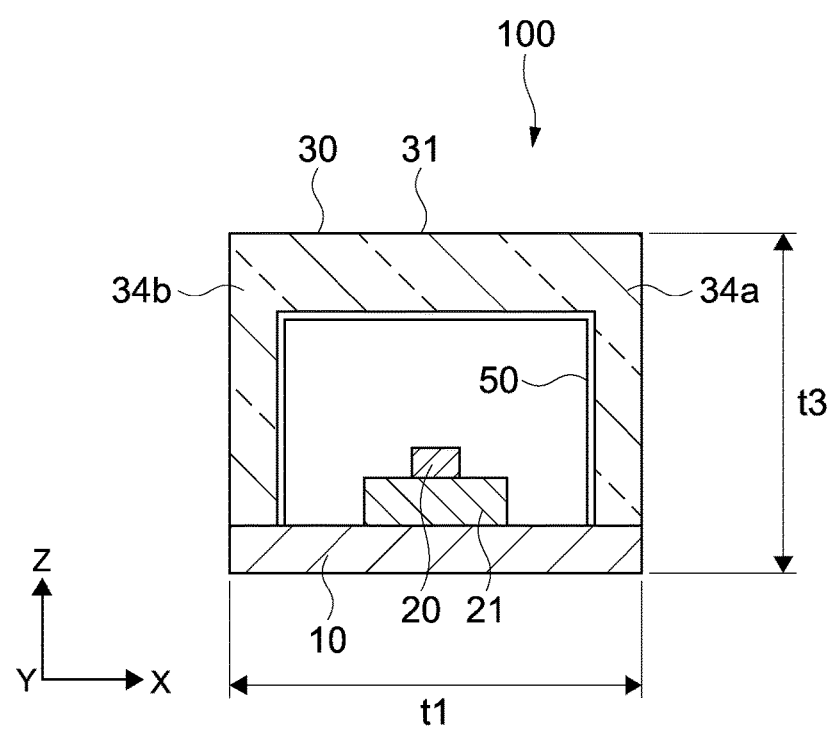

FIG. 3A is a cross-sectional view of the light emitting apparatus 100 taken along a line A-A of FIGS. 1A and 1B, and FIG. 3B is a cross-sectional view of the light emitting apparatus 100 taken along a line B-B of FIGS. 1A and 1B. As shown in FIGS. 1A, 1B, 2, 3A, and 3B, the front surface portion 32 has a light transmission surface 40 that causes the laser light L emitted from the semiconductor laser 20 to pass therethrough. Further, the front surface portion 32 has a protrusion portion 41 provided on a periphery of the light transmission surface 40. The protrusion portion 41 is protruded relative to the light transmission surface 40 along a direction in which the laser light L is transmitted.

As shown in FIGS. 1A, 1B and 2, in this embodiment, around substantially the center of the front surface portion 32, the light transmission surface 40 is set. Further, in an area surrounding three directions of an upper side and right and left sides of the light transmission surface 40, the protrusion portion 41 is provided. That is, the protrusion portion 41 is provided over an upper side area 48 adjacent to the upper side 45 of the front surface portion 32 and two lateral side areas 49a and 49b adjacent to two lateral sides 47a and 47b.

It should be noted that the upper side 45 is a side opposite to the lower side 46 (see FIG. 2) connected with the support surface 11 of the front surface portion 32. Further, the two lateral sides 47a and 47b are disposed between the lower side 46 and upper side 45. As shown in FIGS. 1A, 1B and 2, in the case where the front surface portion 32 is viewed from the front along the Y direction, the shape of the light transmission surface 40 is rectangle, and the shape of the protrusion portion 41 is substantially an inversed U-letter. It should be noted that the light transmission surface 40 corresponds to a light transmission portion in this embodiment.

As shown in FIG. 3A, in this embodiment, an end portion of the upper surface portion 31 on the front surface portion 32 side is protruded relative to the light transmission surface 40 by a protrusion amount t4. With this configuration, the protrusion portion 41 in the upper side area 48 is achieved. Further, end portions of the two side surface portions 34a and 34b on the front surface portion 32 side is protruded relative to the light transmission surface 40 by the protrusion amount t4 in the same way. With this configuration, the protrusion portion 41 on the two lateral side areas 49a and 49b is achieved.

As described above, the upper surface portion 31 and the two side surface portions 34a and 34b are protruded relative to the light transmission surface 40 with the result that it is unnecessary to perform a step of bonding another member or the like to the front surface portion 32, for example. Thus, it is possible to easily provide the protrusion portion 41. It should be noted that a part of the protrusion portion 41 where the upper side area 48 and the lateral side areas 49a and 49b are overlapped is an end portion common to the upper surface portion 31 and the lateral side portion 49a or 49b.

With reference to FIGS. 3A and 3B, a size t1 of the light emitting apparatus 100 in an X direction is approximately 1000 to 1500 μm. A size t2 of the light emitting apparatus 100 in the Y direction is approximately 2000 to 3000 μm. A size t3 of the light emitting apparatus 100 in the Z direction is approximately 1000 to 1500 μm. The protrusion amount t4 of the protrusion portion 41 from the light transmission surface 40 is approximately 50 to 100 μm. It should be noted that the sizes and the amount are not limited to those values and may be designed arbitrarily.

As shown in FIG. 1B and FIG. 3A, the back surface portion 33 of the glass cap 30 has a configuration substantially equal to that of the front surface portion 32. That is, on the back surface portion 33, a rectangular depression portion 37 having substantially the same size as the light transmission surface 40 of the front surface portion 32. A depth of the depression portion 37 is substantially equal to the protrusion amount t4 of the protrusion portion 41.

As shown in FIGS. 3A and 3B, in this embodiment, on an inner surface of the sealed space S of the glass cap 30 and on the light transmission surface 40 of the front surface portion 32, an AR coat (antireflection coat) 50 is formed. With this configuration, it is possible to suppress reflection of the laser light L on the surface of the glass cap 30, and the laser light L can be extracted to outside efficiently. It should be noted that the AR coat 50 may be formed only on a part where the laser light L is transmitted. In this embodiment, not only on the inner surface of the sealed space S but also on the back surface portion 33 or the like, the AR coat 50 is formed. This point will be described later.

A specific configuration of the AR coat 50 is set as appropriate in accordance with a wavelength or the like of the laser light L emitted from the semiconductor laser 20, for example. For example, a dielectric film of tantalum pentoxide, silicon dioxide, or the like is formed as the AR coat 50.

[Method of Manufacturing Light Emitting Apparatus]

Figure 4:
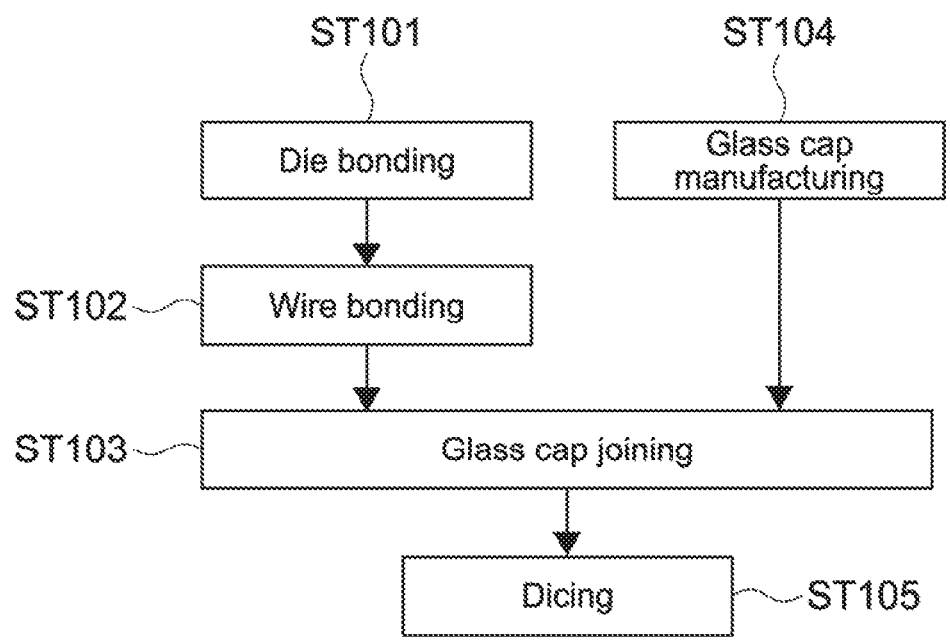
FIG. 4 A flowchart showing an example of a method of manufacturing the light emitting apparatus according to the first embodiment.

FIG. 4 is a flowchart showing an example of a method of manufacturing the light emitting apparatus 100. FIG. 5 to FIG. 10 are diagrams for explaining respective steps.

Figure 5:
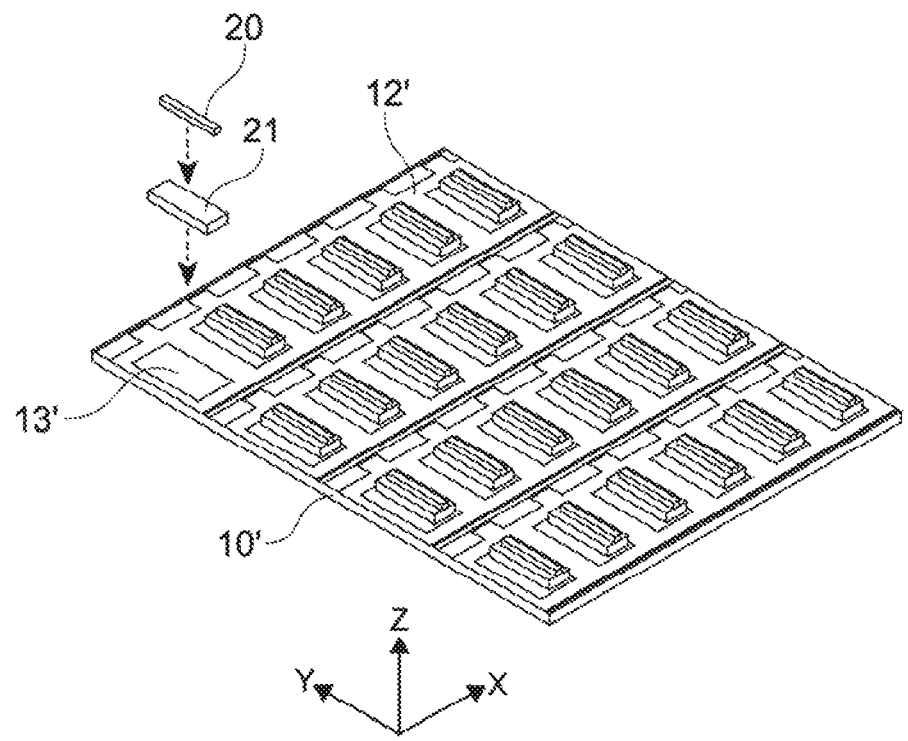
FIG. 5 A schematic diagram for explaining a die bonding step.

First, die bonding is performed (Step 101). As shown in FIG. 5, on a base substrate 10' having a large diameter, a plurality of semiconductor lasers 20 is mounted (chip-mounted) in a matrix pattern through the sub mount 21. It should be noted that on the base substrate 10', a first electrode 12' and a second electrode 13' are formed.

Bonding of the semiconductor laser 20 and the sub mount 21 and bonding of the sub mount 21 and the base substrate 10' are performed by, for example, solder bonding by using solder paste such as AuSn, metal bonding, any other wafer bonding methods, or the like.

In FIG. 5, six semiconductor lasers 20 in the X direction and four semiconductor lasers 20 in the Y direction, that is, 24 semiconductor lasers 20 in total are mounted, but the number is not limited to this. More semiconductor lasers 20 can be mounted at one time.

It should be noted that the semiconductor laser 20 may be mounted on the base substrate 10' without the sub mount 21. For example, in the case where the semiconductor laser 20 is mounted in a junction-down fashion, a light emitting point is on a lower portion of a chip, so the sub mount 21 is used. On the other hand, in the case where the semiconductor laser 20 is mounted in a junction-up fashion, the semiconductor laser 20 is mounted on the base substrate 10' without using the sub mount 21. Of course, the way of mounting not limited to those.

Figure 6:
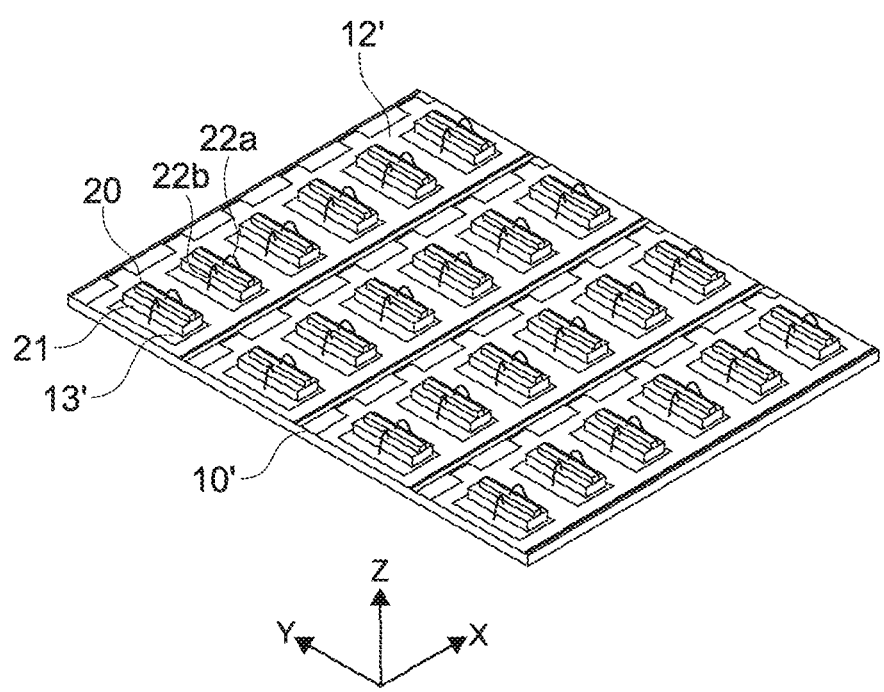
FIG. 6 A schematic diagram for explaining a wire bonding step.

Wire bonding is performed (Step 102). As shown in FIG. 6, for each of the plurality of semiconductor lasers 20, with wires 22a and 22b, the first electrode 12' and second electrode 13' are connected with the semiconductor laser 20.

Figure 7:
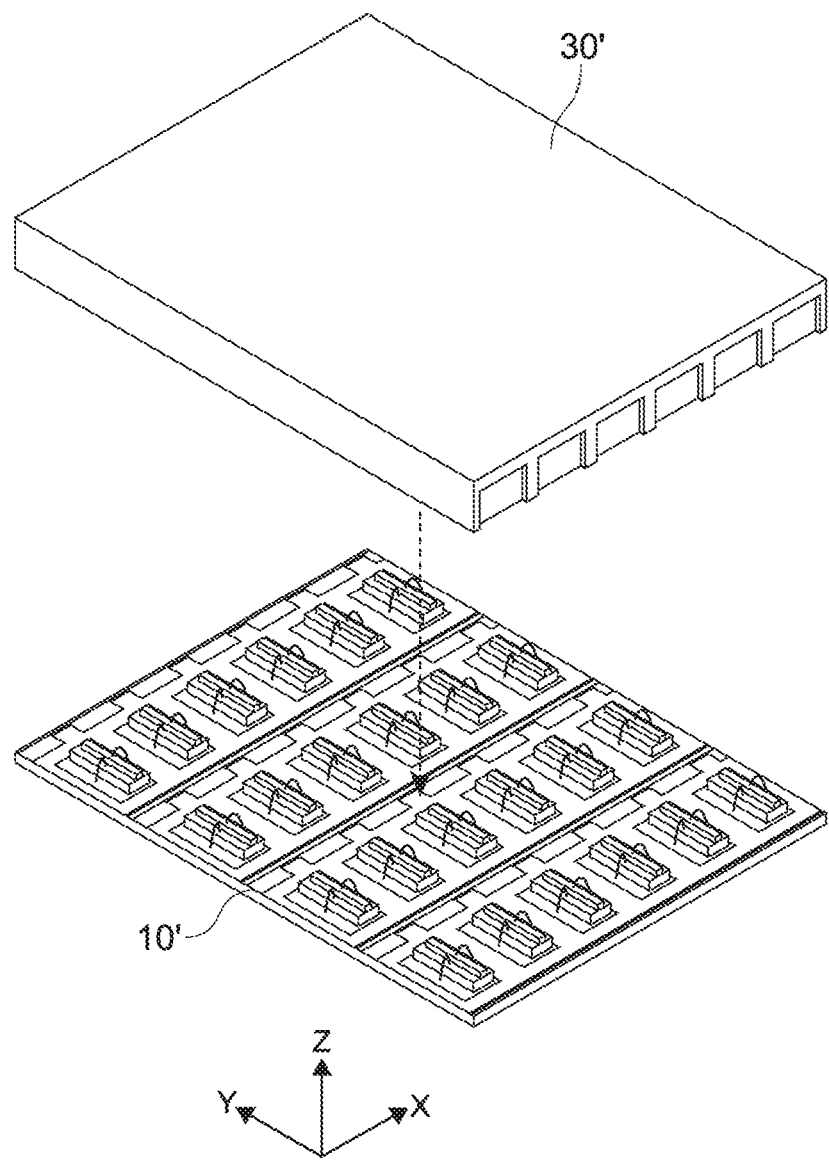
FIG. 7 A schematic diagram for explaining a glass cap bonding step.
Figure 8:
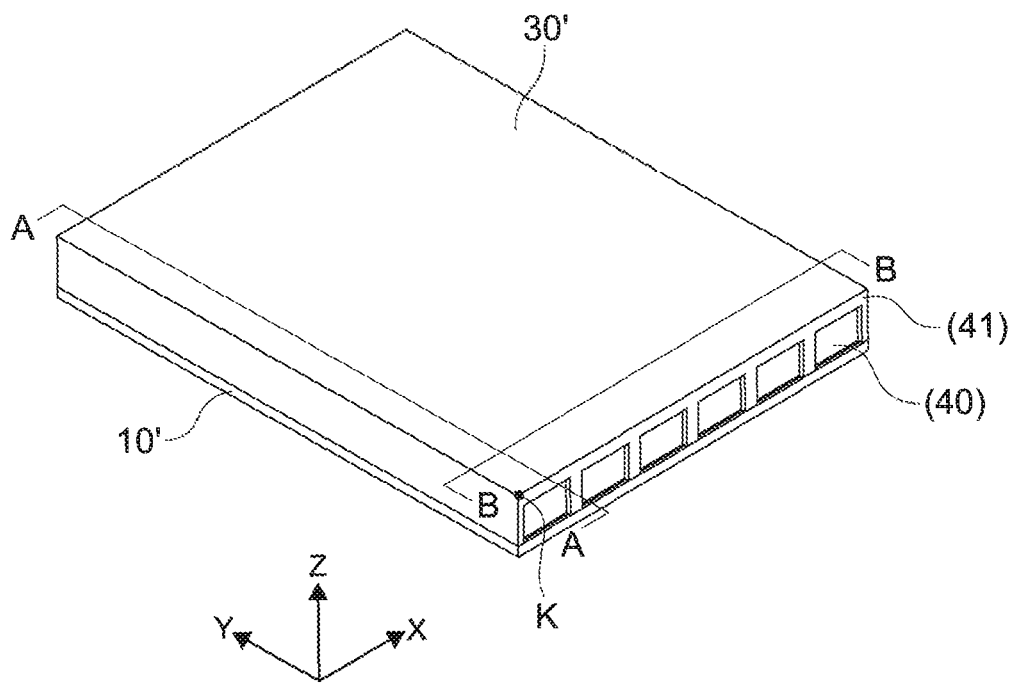
FIG. 8 A schematic diagram for explaining a glass cap bonding step.

As shown in FIG. 7 and FIG. 8, the glass cap 30' is bonded to the base substrate 10' (Step 103). Bonding of the glass cap 30' is carried out by solder bonding, metal bonding, or the like as described above. For example, Ag paste, low-melting-point glass, or the like may be used as an adhesive.

Figure 11:
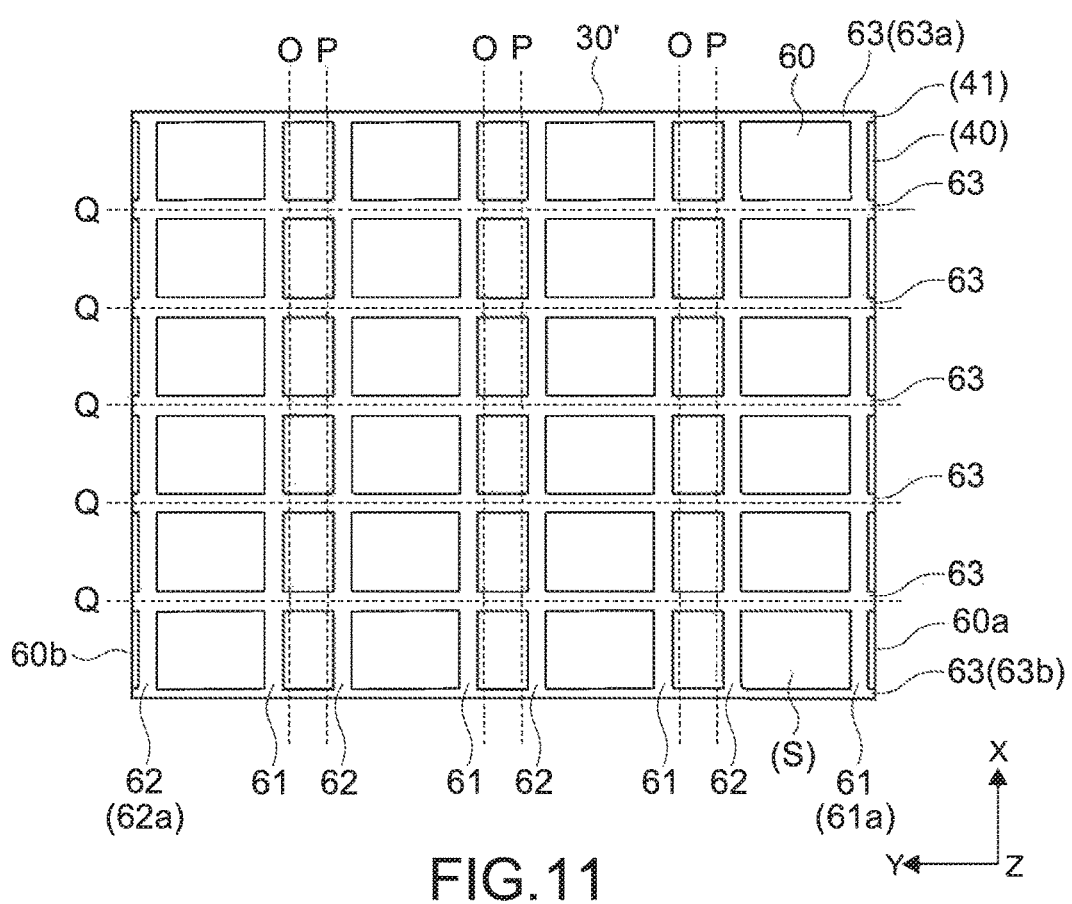
FIG. 11 A schematic diagram showing a configuration example of a side to be bonded on a base substrate of the glass cap.

FIG. 11 is a schematic diagram showing a configuration example on a side of the glass cap 30' which is bonded to the base substrate 10'. Broken lines in FIG. 11 indicate cut lines O, P, and Q along which cutting is performed in a subsequent dicing step.

Figure 10:
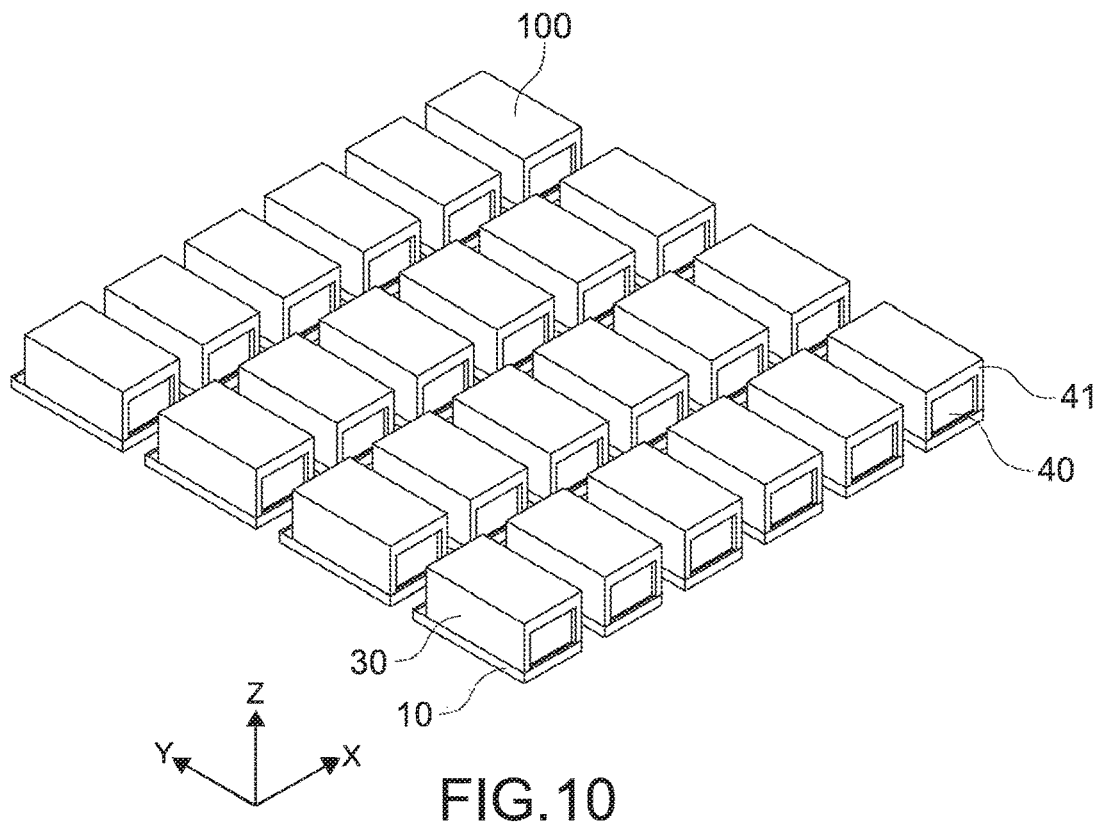
FIG. 10 A schematic diagram for explaining a dicing step.
Figure 12A:
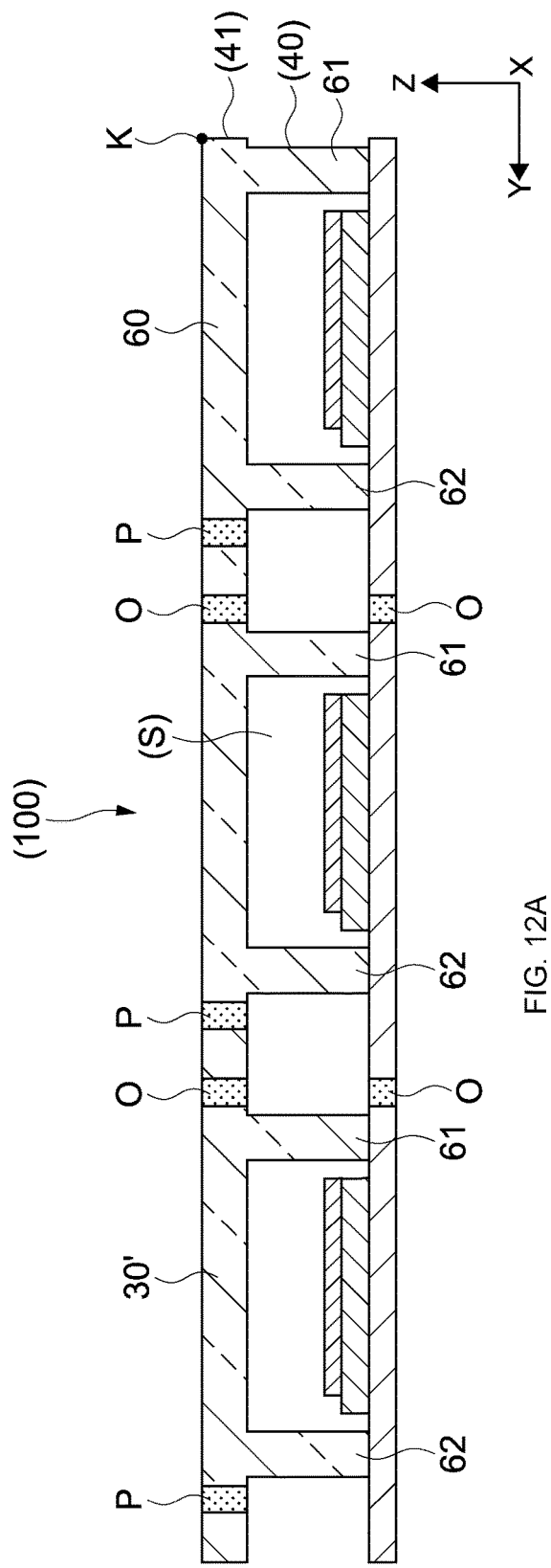
FIGS. 12A and 12B Cross-sectional views of FIG. 10 taken along a line A-A and a line B-B.
Figure 12B:
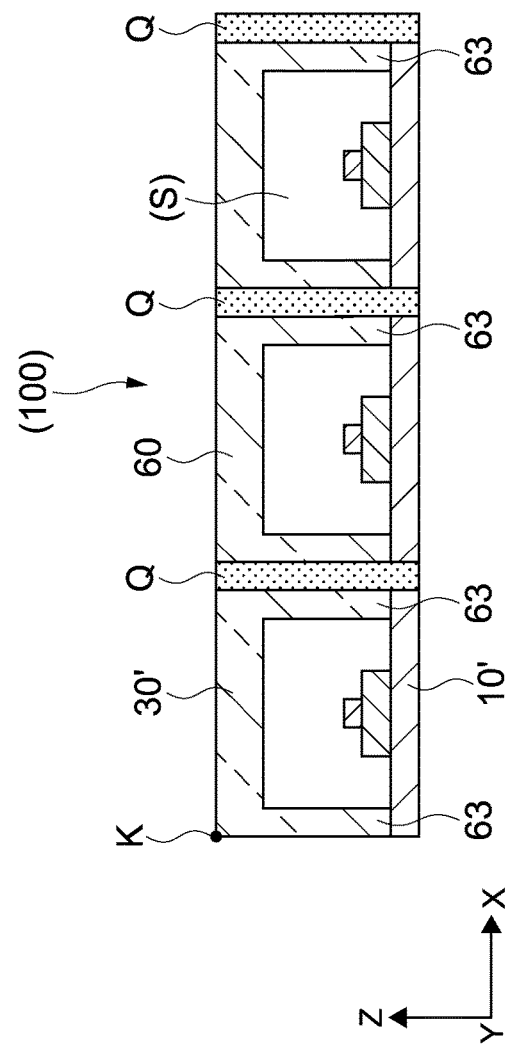

FIG. 12A is a cross-sectional view of FIG. 10 taken along a line A-A, and FIG. 12B is a cross-sectional view of FIG. 10 taken along a line B-B. Due to limitations of space, in FIG. 12A, three light emitting apparatuses 100 (light emitting packages) from a vertex K shown in FIG. 11 are shown.

As shown in FIGS. 11, 12A, and 12B, the glass cap 30' includes a main surface portion 60, a light transmission side member 61, a rear side member 62, and a lateral side member 63. The main surface portion 60 is a portion which corresponds to the upper surface portion 31 shown in FIGS. 1A and 1B and the like and which faces the base substrate 10' at a time of bonding with the base substrate 10'. That is, the main surface portion 60 is a portion whose planar direction is parallel to an XY plane direction at the time of bonding.

The light transmission side member 61 is a portion which corresponds to the front surface portion 32 including the light transmission surface 40 shown in FIGS. 1A and 1B and the like. As shown in FIGS. 11, 12A, and 12B, the light transmission side member 61 is protruded in a direction orthogonal to the main surface portion 60 (Z direction) and is extended in the X direction.S The light transmission side member 61a disposed on a right end in FIG. 11 is formed on a position offset inwards by the protrusion amount t4 (see FIGS. 3A and 3B) from a right end portion 60a of the main surface portion 60. On a left side of the light transmission side member 61a at the right end, a plurality of light transmission side members 61 is formed at an interval corresponding to a size of one light source apparatus 100. It should be noted that positions of the plurality of light transmission side members correspond to positions of the plurality of semiconductor lasers 20 on the base substrate 10'.

The rear side member 62 is a portion which corresponds to the back surface portion 33 shown in FIGS. 1A and 1B or the like. The rear side member 62 has substantially the same configuration as the light transmission side member 61 and is formed on the left side of the light transmission side member 61 with a gap by a size of the sealed space S. The rear side member 62a disposed at a left end in FIG. 11 is formed on a position offset inwards by a depth (size substantially equal to the protrusion amount t4) of the depression portion 37 from a left end portion 60b of the main surface portion 60.

The lateral side member 63 is a portion which corresponds to the side surface portions 34a and 34b shown in FIGS. 1A and 1B and the like. The lateral side member 63 is protruded from the main surface portion 60 in the Z direction so as to be extended in the Y direction. As shown in FIG. 11, a plurality of lateral side members 63 is formed at an interval of a size of the sealed space S. Widths of the lateral side members 63a and 63b at upper and lower ends are equal to widths of the side surface portions 34a and 34b. Widths of other lateral side members 63 are substantially double widths of the side surface portions 34a and 34b.

The glass cap 30' is manufactured by pressing using a mold or etching, for example, in Step 104 in FIG. 4. In this embodiment, the glass cap 30' is entirely integrally made of the same glass material. That is, the main surface portion 60 and the light transmission side member 61 are integrally formed.

With this configuration, for example, it is possible to omit a step of assembling the light transmission side member 61 or the like to the main surface portion 60, and thus a manufacturing process of the light emitting apparatus 100 can be simplified. It should be noted that the glass cap 30' before the dicing step corresponds to a covering member in this embodiment.

When the glass cap 30' is manufactured, the AR coat 50 is formed over the entire main surface portion 60. For example, a dielectric film such as tantalum pentoxide and silicon dioxide is deposited singly, or multiple films are alternately deposited, thereby forming the AR coat 50. It should be noted that the deposition method is not limited, and sputtering, evaporation, or the like may be used as appropriate.

In the bonding step in Step 103, the base substrate 10' and the glass cap 30' are bonded in such a manner that the light transmission side member 61 is connected to a predetermined position with respect to the plurality of semiconductor lasers 20 on the base substrate 10', that is, position which faces an exit surface of the semiconductor laser 20.

Figure 9:
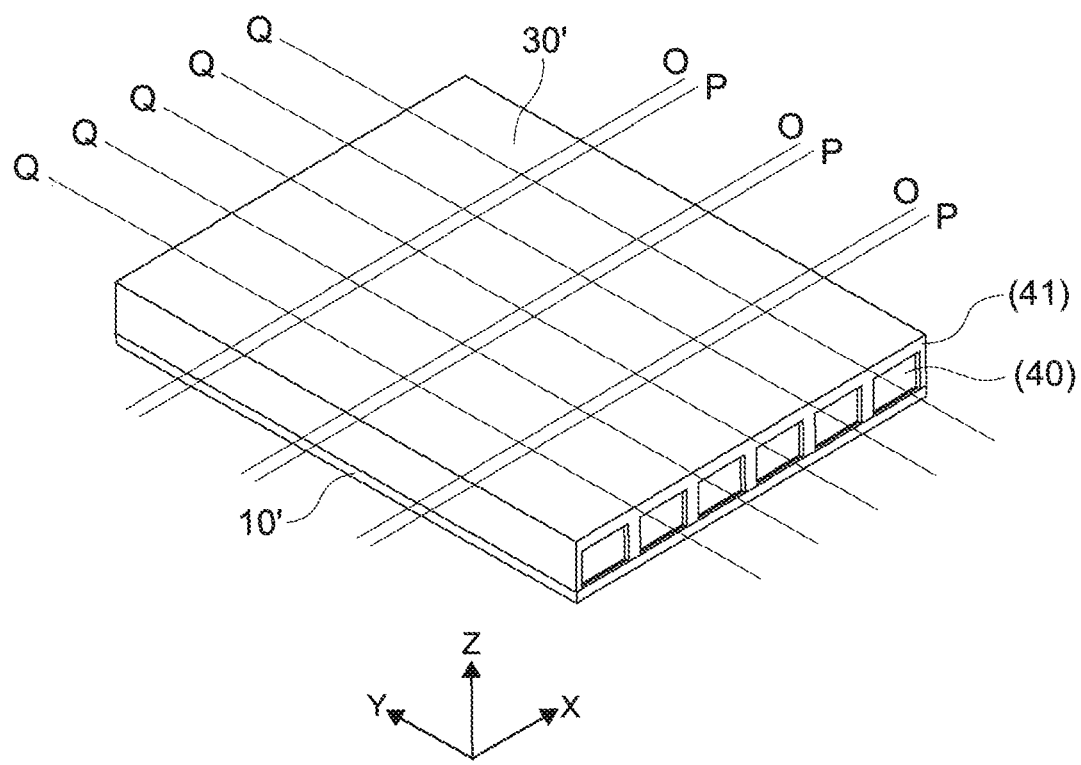
FIG. 9 A schematic diagram for explaining a dicing step.

As shown in FIG. 9 and FIG. 10, a plurality of light emitting apparatuses 100 is separated by dicing (Step 105). The dicing is carried out along the cut lines O, P, and Q shown in FIGS. 9, 11, 12A and 12B. It should be noted that in FIGS. 12A and 12B, entire areas to be cut are denoted by the same symbols.

The cut line O is set on a position offset by the protrusion amount t4 toward a side to which light is transmitted relative to a light transmission surface 40 of the light transmission side member 61 of the main surface portion 60. In FIG. 11, a right side corresponds to the side to which light is transmitted. Also, in FIG. 12A, the right side corresponds to the side to which light is transmitted.

As shown in FIG. 12A, along the cut line O, the main surface portion 60 and the base substrate 10' are cut. With this configuration, the front surface portion 32 having the light transmission surface 40 and the protrusion portion 41 shown in FIGS. 1A and 1B and the like can be easily achieved. It should be noted that the method of dicing is not limited, and any dicing technique using a dicing blade, a laser, or the like may be used.

The cut line P is set on a position offset by a size of the depression portion 37 (size substantially equal to the protrusion amount t4) in a direction opposite to a light transmission direction relative to the rear side member 62 of the main surface portion 60. As shown in FIG. 12A, along the cut line P, only the main surface portion 60 is cut. On a rear side relative to the rear side member 62 of the base substrate 30', the first electrode 12' and the second electrode 13' are formed.

The cut line Q is set on substantially a center of the lateral side member 63. Along the cut line Q, the lateral side member 63 and the base substrate 10' are cut. After cutting along the cut lines O, P, and Q, for example, by extending dicing tape or the like that supports the base substrate 10', the plurality of light emitting apparatuses 100 is separated into pieces.

As described above, in the light emitting apparatus 100 according to this embodiment, in the periphery of the light transmission surface 40 through which the laser light L from the semiconductor laser 20 is transmitted, the protrusion portion 41 is provided. The protrusion portion 41 protects the light transmission surface 40. Thus, for example, it is possible to suppress an occurrence of a failure such as a reduction in optical output and a dispersion loss due to a crack at a time of handling.

As shown in FIGS. 1A and 1B and the like, in this embodiment, the protrusion portion 41 is provided in such a manner that upward, leftward, and rightward directions of the light transmission surface 40 set on substantially the center of the front surface portion 32 are surrounded. With this configuration, it is possible to sufficiently protect the light transmission surface 40.

Further, as shown in FIG. 5 to FIG. 10, packaging the plurality of light emitting apparatuses 100 can be collectively performed on a wafer level. With this configuration, it is possible to manufacture the plurality of light emitting apparatuses 100 with very high productivity. Further, multiple, box-shaped glass caps 30 are integrally formed, thereby making it possible to simplify the manufacturing process. Further, the protrusion portion 41 which protects the light transmission surface 40 can be easily manufactured.

Second Embodiment

A light emitting apparatus according to a second embodiment of the present technology will be described. In the following description, description of similar parts to the configurations and actions in the light emitting apparatus 100 described in the above embodiment will be omitted or simplified.

Figure 13:
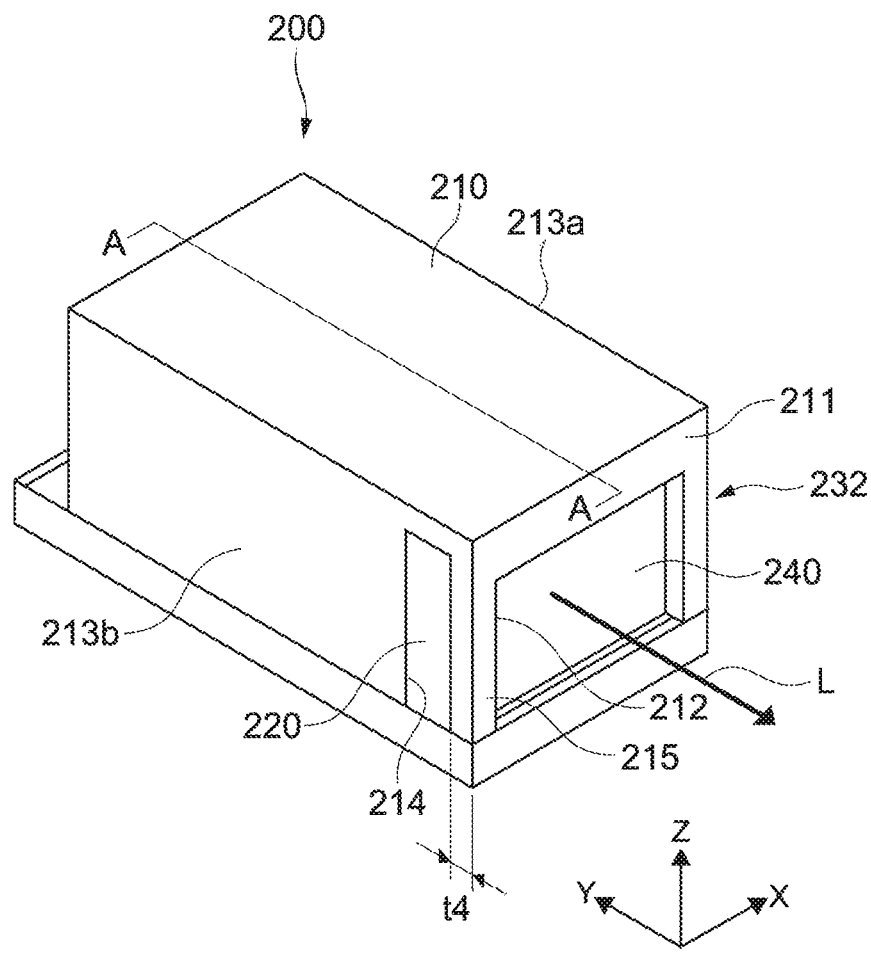
FIG. 13 A perspective view schematically showing a configuration example of a light emitting apparatus according to a second embodiment.
Figure 14:
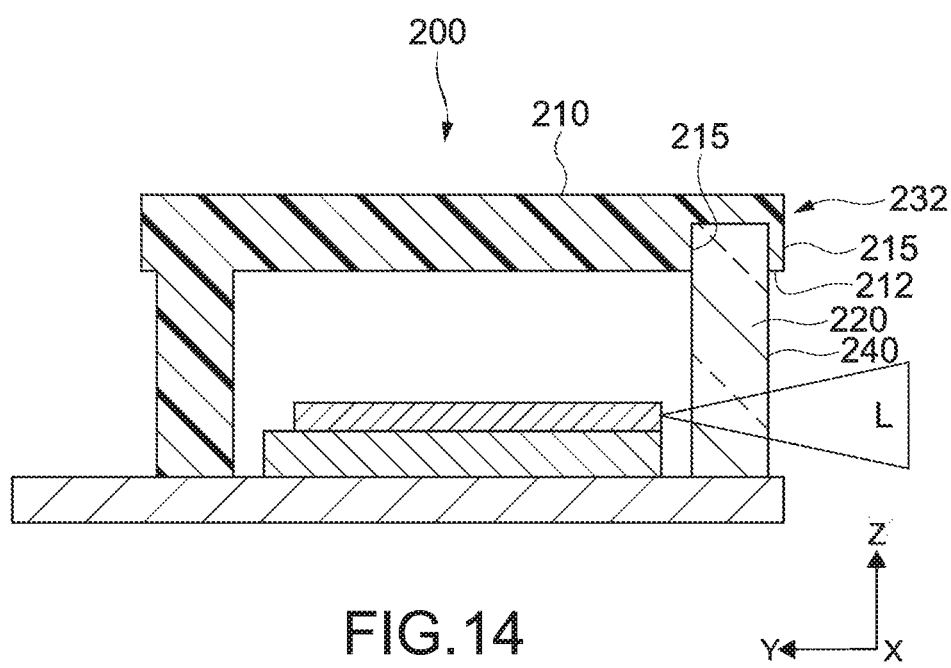
FIG. 14 A cross-sectional view of FIG. 13 taken along a line A-A.

FIG. 13 is a perspective view schematically showing a configuration example of a light emitting apparatus 200 according to this embodiment. FIG. 14 is a cross-sectional view of the light emitting apparatus 200 taken along a line A-A of FIG. 13.

The light emitting apparatus 200 includes a cap member 210, a plate-shaped glass member 220. The cap member 210 has an outline of a substantially parallelepiped shape and has a through hole 212 on an emitting side surface 211 from which the laser light L is emitted. Further, on the emitting side surface 211 side of two side surfaces 213a and 213b of the cap member 210, cutouts 214 extended in the Z direction are formed. The cutouts 214 are formed on positions separated by the protrusion amount t4 from a surface of a peripheral portion 215, which is a peripheral part of the through hole 212.

The glass member 220 is fitted to the cutouts 214 formed on the two side surfaces 213a and 213b. Therefore, the glass member 220 is connected to the peripheral portion 215 from an inner side of the cap member 210 so as to block the through hole 212. An area on substantially a center of the glass member 220 is a light transmission surface 240, and the laser light L is emitted therefrom to outside. The peripheral portion 215 on the periphery of the through hole 212 functions as a protrusion portion which protects the light transmission surface 240.

The glass member 220 corresponds to a light transmission side member in this embodiment. Further, the cap member 210 and the glass member 220 constitute a cover portion according to this embodiment. Thus, a front surface portion 232 of the cover portion includes the through hole 212, the peripheral portion 215 (protrusion portion), and a light transmission member.

Figure 15A:
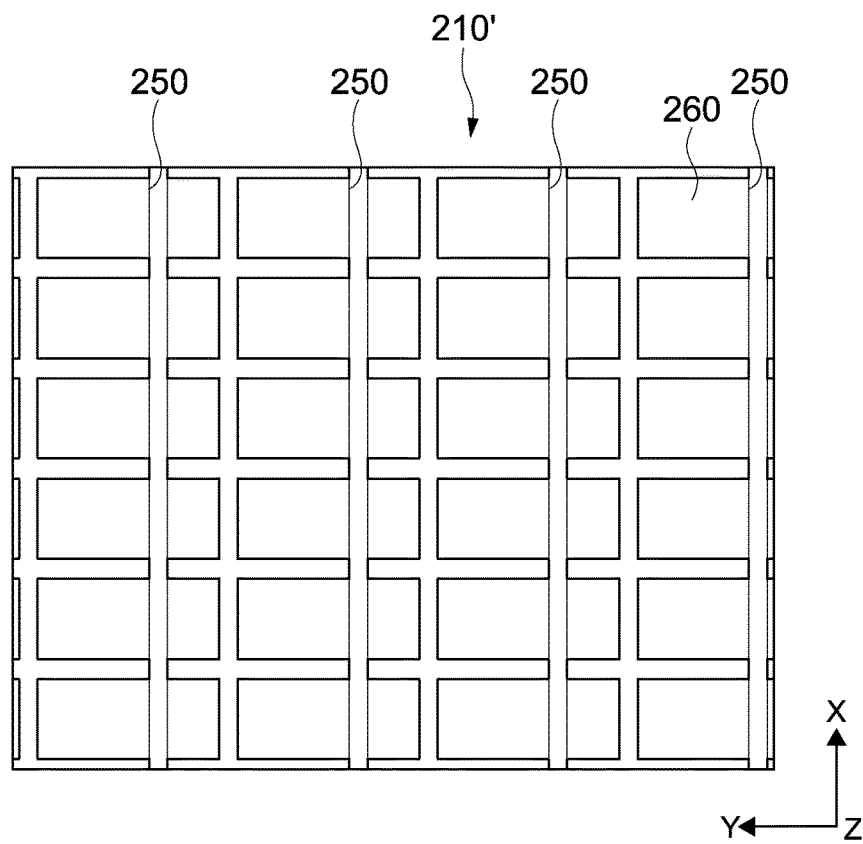
FIGS. 15A and 15B Diagrams for explaining an example of a method of manufacturing a light emitting apparatus according to the second embodiment.
Figure 15B:
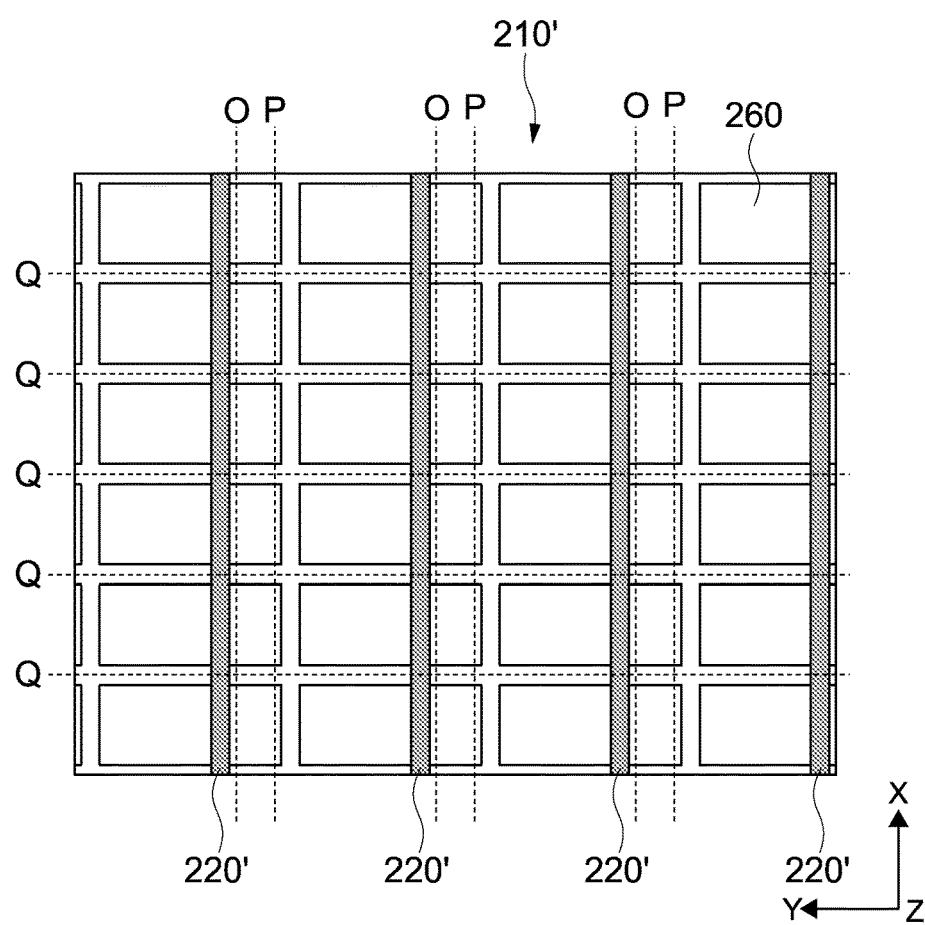

FIGS. 15A and 15B are diagrams for explaining an example of a method of manufacturing the light emitting apparatus 200 according to this embodiment. As compared to a process flow shown in FIG. 4, manufacturing the glass cap in Step 104 is changed to manufacturing and assembling a cap member 210' and a glass member 220'. Further, bonding the glass cap in Step 103 is changed to a step of bonding the assembled cap member 210' and glass member 220' to a base substrate.

FIG. 15A is a schematic diagram showing a configuration example of the cap member 210' on a bonding side. On a position where the light transmission side member 61 shown in FIG. 11 is disposed, grooves 250 are formed. The groove 250 is also formed on a main surface portion 260 (see FIG. 14). The cap member 210' is formed by performing pressing or etching for a semiconductor material such as silicon, for example.

As shown in FIG. 15B, to the grooves 250 formed on the cap member 210', the glass member 220', which is a light transmission side member separately provided from the cap member 210' is bonded. For example, any bonding technique such as solder bonding may be used. Dicing is carried out along cut lines O, P, and Q shown in FIG. 15B. Thus, the light emitting apparatus 200 shown in FIG. 13 is manufactured.

As described above, the member for which the light transmission surface 240 is set and the member that functions as the protrusion portion may be made of different materials. In this case, to configure the cover portion, a step of assembling both the members is required. However, depending on configurations, materials, or the like of the members, a manufacturing process of the members can be simplified as compared to a case where the glass materials are integrally processed. Further, for only a part corresponding to the light transmission surface 240 through which light is transmitted, glass, sapphire, or the like can be used, and a remaining part can be made of silicon or the like. Thus, it is possible to suppress a material cost.

Other Embodiments

The present technology is not limited to the embodiments described above, and various other embodiments can be achieved.

FIGS. 16A, 16B, 17A, and 17B are cross-sectional views each showing a configuration example of a light emitting apparatus according to another embodiment. In light emitting apparatuses 300 and 310 shown in FIGS. 16A and 16B, an area S1 of a cross section of a part D1 connected to an upper surface portion 331 of a front surface portion 332 is larger than an area S2 of a cross section of a part D2 connected to a support surface 311. That is, an area of a cross section of a part of the light transmission side member formed on a main surface portion which is connected to a main surface portion is set to be larger than a cross sectional area of a part connected to a support surface.

Figure 16A:
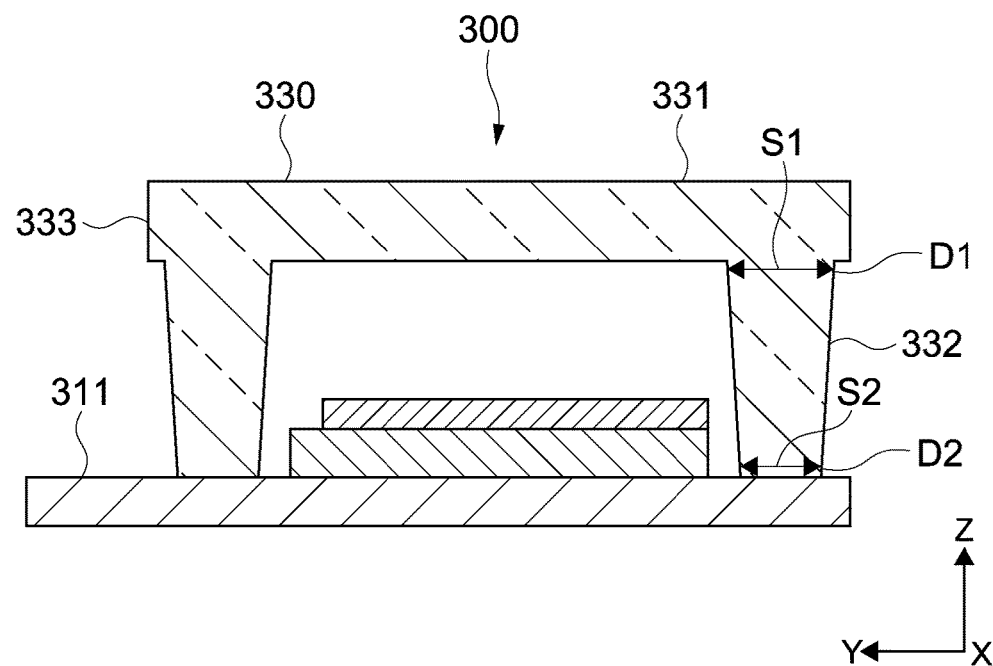
FIGS. 16A and 16B Cross-sectional views showing a configuration example of a light emitting apparatus according to another embodiment.

In the front surface portion 332 (light transmission side member) shown in FIG. 16A, the area of the cross section is increased from the part D2 connected to the support surface 311 toward the part D1 connected to the upper surface portion 331. On the other hand, in the front surface portion 332 (light transmission side member) shown in FIG. 16A, the part D1 connected to the upper surface portion 331 has a curved shape (curved surface shape). In this way, by setting the area S1 of the cross section of the part D1 connected to the upper surface portion 331 to be large, it is possible to enhance an intensity of an entire glass cap 330. It should be noted that to a case where a different glass member is used for the front surface portion 332, the present technology can also be applied.

Figure 16B:
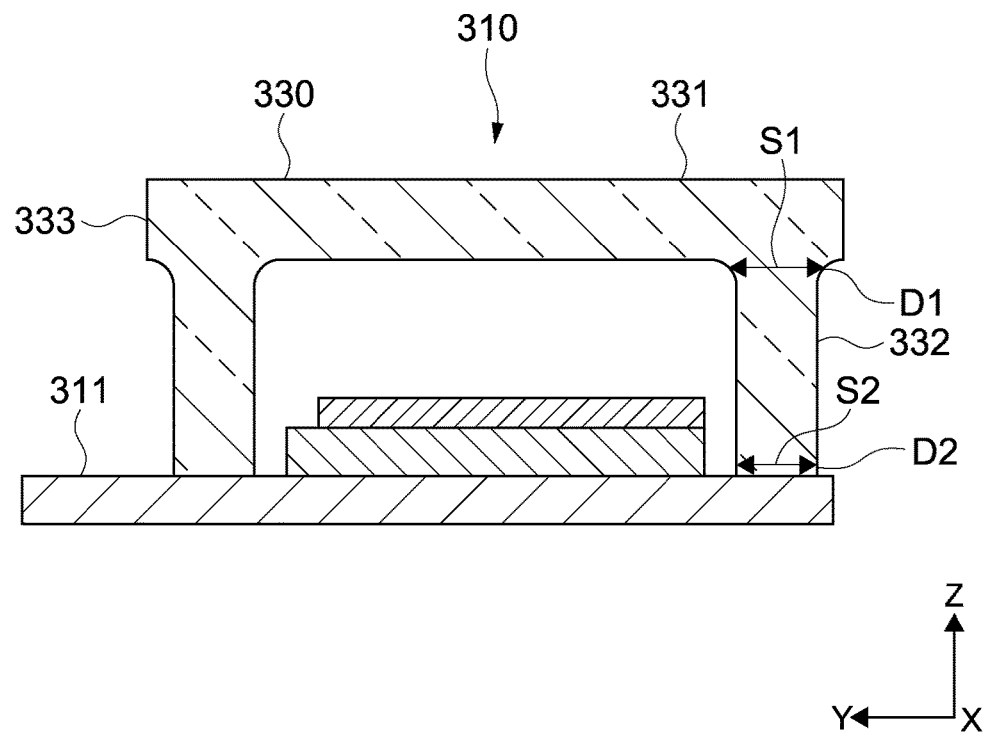

As shown in FIGS. 16A and 16B, for a back surface portion 333, it is also possible to enhance an intensity thereof by increasing an area of a part connected to the upper surface portion 331. Further, for two side surface portions, by using a similar configuration, it is also possible to enhance an intensity thereof.

Figure 17A:
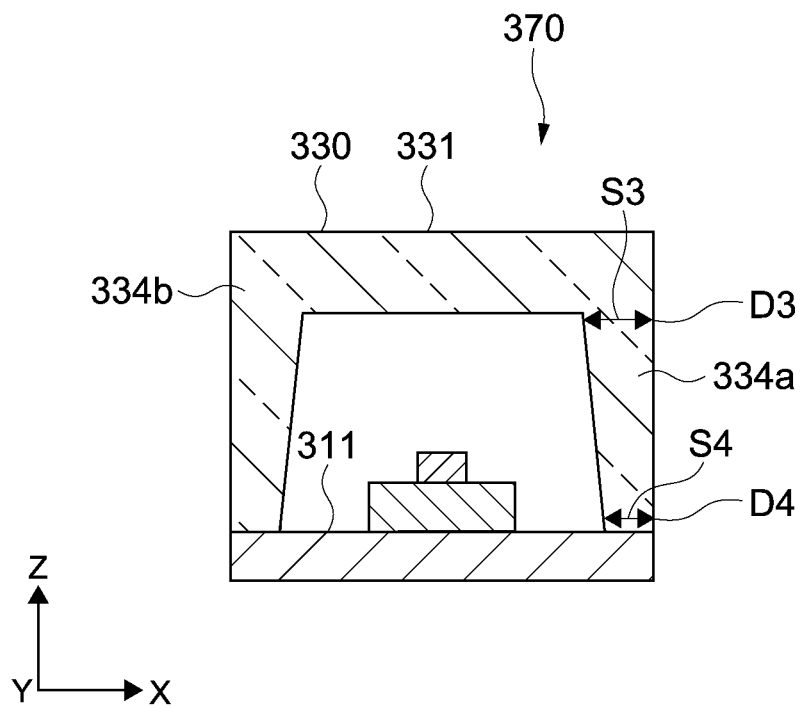
FIGS. 17A and 17B Cross-sectional views showing a configuration example of a light emitting apparatus according to another embodiment.
Figure 17B:
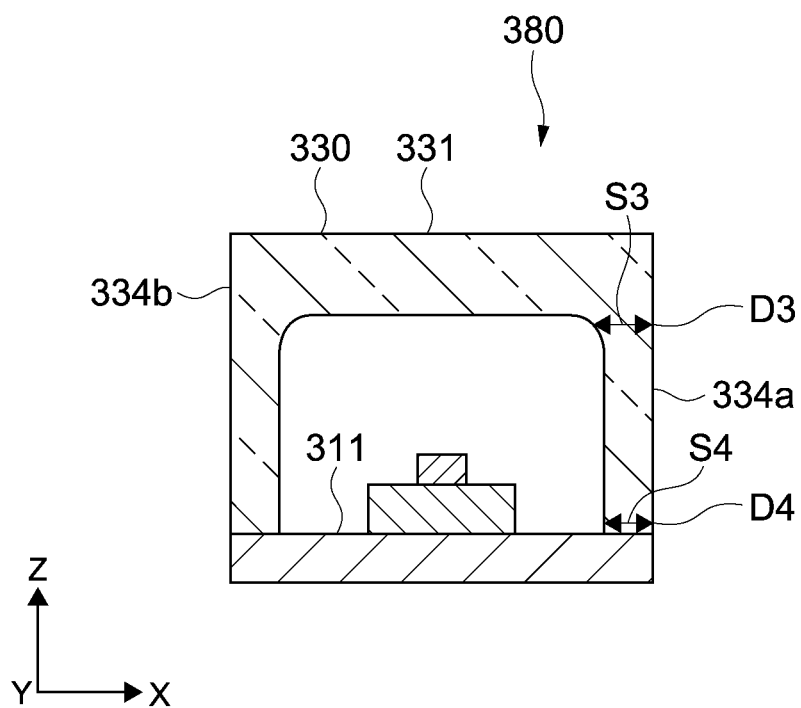

In light emitting apparatuses 370 and 380 shown in FIGS. 17A and 17B, for two side surface portions 334a and 334b, an area S3 of a cross section of a part D3 connected to the upper surface portion 331 is set to be larger than an area S4 of a cross section of a part D4 connected to the support surface 311. In FIG. 17A, an area of a cross section is increased from the part D4 on the support surface 311 side to the part D3 on the upper surface portion 331 side. In FIG. 17B, the part D3 on the upper surface portion 331 side has a curved shape (curved surface shape). With this configuration, it is possible to enhance an intensity of the entire glass cap 330.

The light emitting apparatuses shown in FIGS. 16A, 16B, 17A and 17B can be achieved by appropriately processing shapes of the light transmission side member, rear side member, and lateral side member in a step of manufacturing the glass cap shown in Step S104 of FIG. 4.

Figure 18:
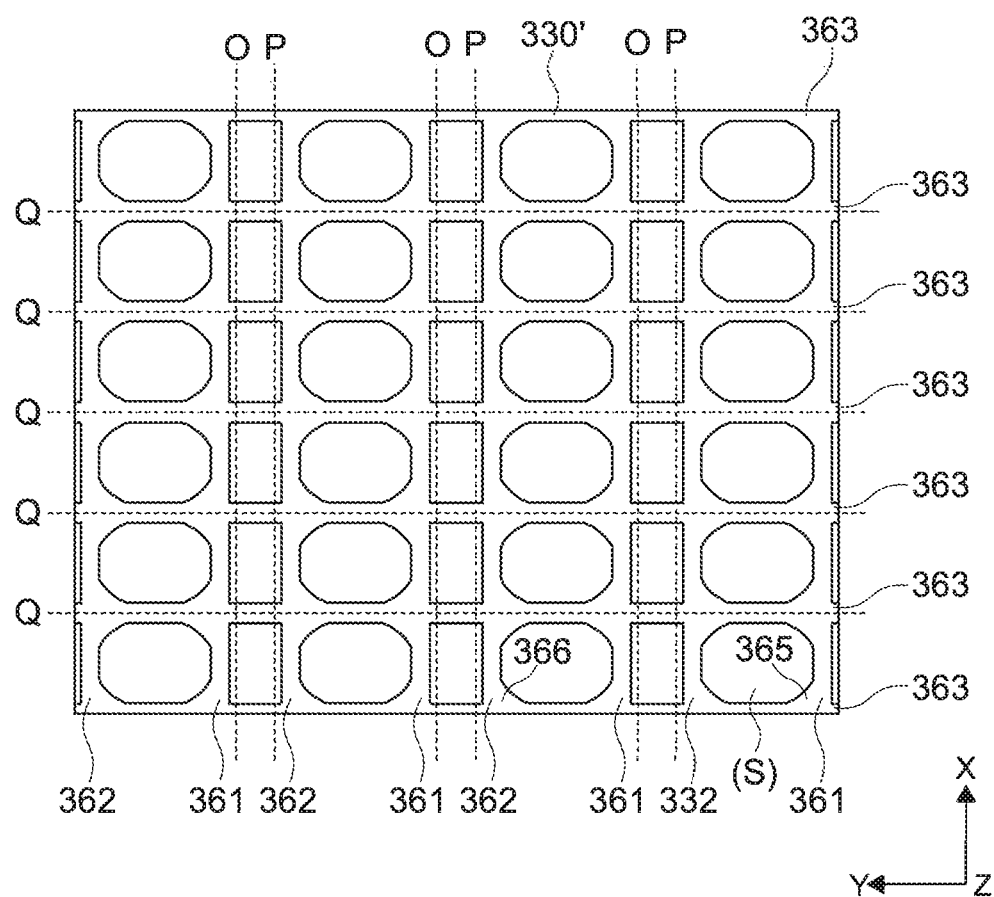
FIG. 18 A schematic diagram showing another configuration example of a glass cap shown in FIG. 11.

FIG. 18 is a schematic diagram showing another configuration example of the glass cap shown in FIG. 11. In a glass cap 330' shown in FIG. 18, a size (volume) of a connection portion 365 between a light transmission side member 361 and a lateral member 363 and a size (volume) of a connection portion 366 of a rear side member 362 and the lateral member 363 are set to be large. A shape of each of the connection portions 365 and 366 on the sealed space S side is a curved shape (curved surface shape). Thus, when the sealed space S is viewed in the Z direction, four corner portions thereof have the curved surface shape. Of course, the shape is not limited to this, and the shape of each of the connection portions 365 and 366 on the sealed space S side may be set to be a linear shape (flat plane shape). By setting the sizes of the connection portions 365 and 366, it is possible to enhance an intensity of the glass cap.

Figure 19A:
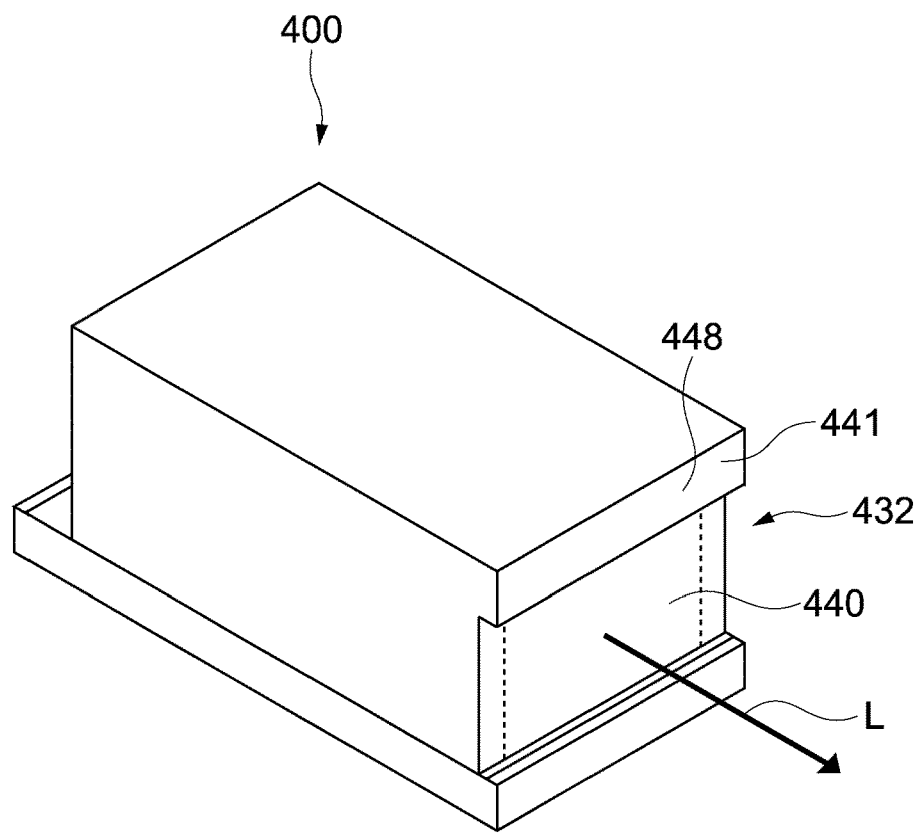
FIGS. 19A and 19B Perspective views schematically showing a light emitting apparatus according to another embodiment.
Figure 19B:
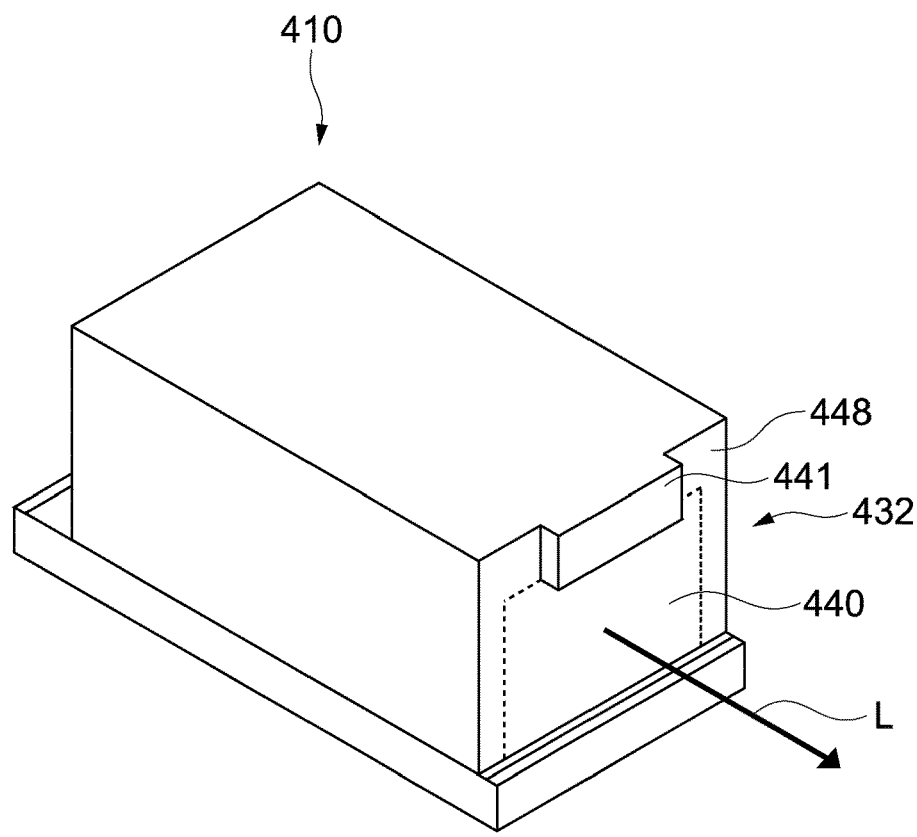

FIGS. 19A and 19B are perspective views schematically showing a light emitting apparatus according to another embodiment. In the first and second embodiments, the protrusion portion is provided over the entire periphery of the light transmission surface. The configuration thereof is not limited to this. A protrusion portion may be provided on a part of the periphery of the light transmission surface.

For example, like a light emitting apparatus 400 shown in FIG. 19A, only on an upper side area 448 of a front surface portion 432, a protrusion portion 441 may be provided. In this way, by configuring the protrusion portion 441 on an upper area of a light transmission surface 440, it is possible to protect the light transmission surface 440. Further, like a light emitting apparatus 410 shown in FIG. 19B, on a part of the upper side area 448, the protrusion portion 441 may be provided.

Figure 20A:
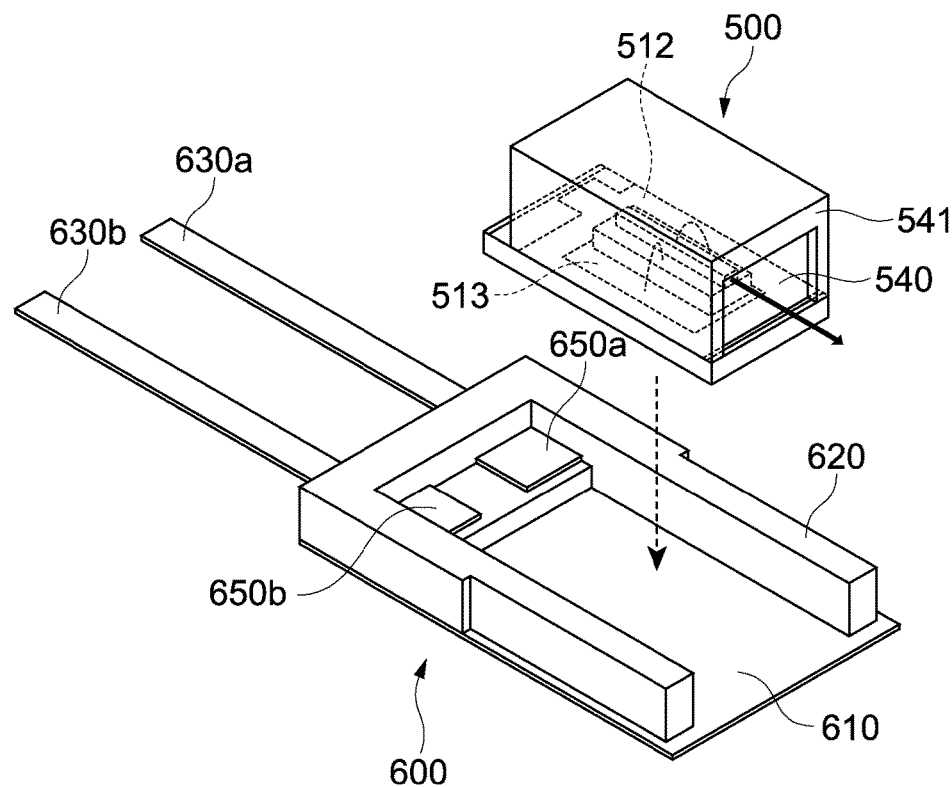
FIGS. 20A and 20B Schematic diagrams showing an attachment example of the light emitting apparatus according to the present technology to a lead frame.
Figure 20B:
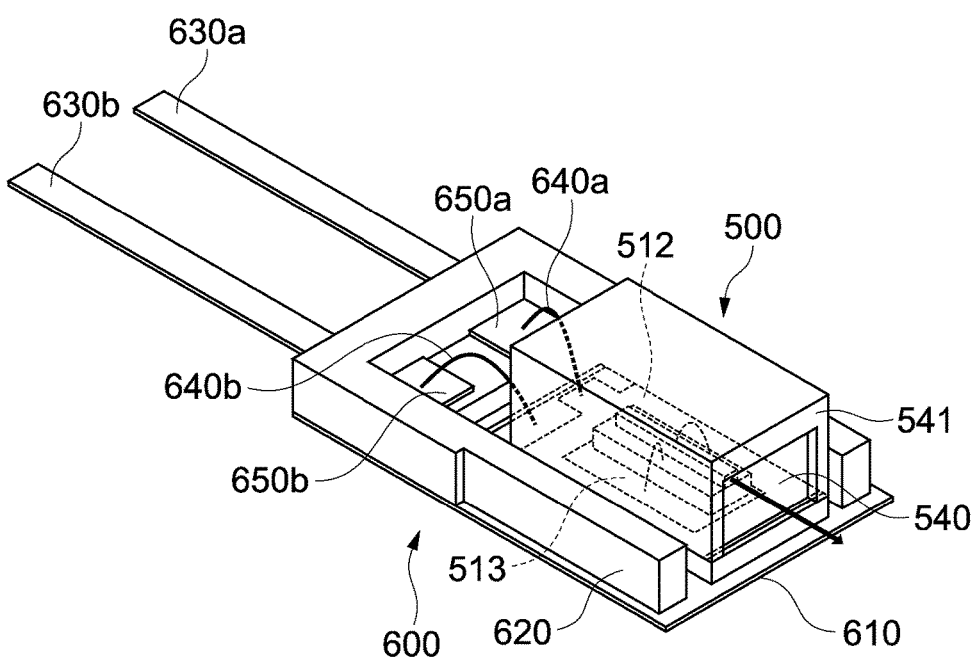

FIGS. 20A and 20B are schematic diagrams showing an example of attachment of a light emitting apparatus 500 according to the present technology to a lead frame 600. The lead frame 600 includes a base frame 610 made of a metal material such as copper, a support frame 620 made of a resin material, and two leads 630*a* and 630*b* for an anode and a cathode.

As shown in FIG. 20A, to an attachment position on a base frame 610 surrounded by the support frame 620, the light emitting apparatus 500 is attached. Through two wires 640*a* and 640*b* and two pads 650*a* and 650*b*, the leads 630*a* and 630*b* and first and second electrodes 512 and 513 in the light emitting apparatus 500 are connected. In this way, also in a case where attaching to the lead frame 600 and packaging are performed, a protrusion portion 541 sufficiently protects a light transmission surface 540. Thus, it is possible to sufficiently suppress an occurrence of a failure.

Out of the feature parts according to the present technology described above, at least two feature parts can be combined. That is, the various feature parts described in the embodiments may be arbitrarily combined irrespective of the embodiments. Further, various effects described above are merely examples and are not limited, and other effects may be exerted.

It should be noted that the present technology can take the following configurations.

(1) A light emitting apparatus, including:
a base portion including a support surface;
a light emitting element provided on the support surface of the base portion;
a cover portion including a light transmission portion through which light emitted from the light emitting element is transmitted and a protrusion portion which is provided on at least a part of a periphery of the light transmission portion and protruded relative to the light transmission portion, the cover portion being provided on the support surface in such a manner as to cover the light emitting element.

(2) The light emitting apparatus according to (1), in which the protrusion portion is protruded along a direction of transmission of light emitted from the light emitting element.

(3) The light emitting apparatus according to (1) or (2), in which
the cover portion includes a plurality of side surface portions which surrounds the light emitting element, and
the light transmission portion and the protrusion portion are provided on a first side surface portion out of the plurality of side surface portions.

(4) The light emitting apparatus according to (3), in which
the first side surface portion includes a lower side connected with the support surface and an upper side opposite thereto, and
the protrusion portion is provided on an upper side area adjacent to at least the upper side.

(5) The light emitting apparatus according to (4), in which
the first side surface portion includes two lateral sides disposed between the lower side and the upper side, and
the protrusion portion is disposed on two lateral side areas adjacent to the upper side area and the two lateral sides.

(6) The light emitting apparatus according to any one of (3) to (5), in which
the cover portion includes an upper surface portion which faces the support surface, and
the protrusion portion includes an end portion of the upper surface portion on the first side surface portion side, the end portion being protruded relative to the light transmission surface.

(7) The light emitting apparatus according to any one of (3) to (6), in which
the cover portion includes two second side surface portions connected with the first side surface portion, and
the protrusion portion includes end portions of the two second side surface portions on the first side surface portion side, the end portions being protruded relative to the light transmission surface.

(8) The light emitting apparatus according to any one of (1) to (7), in which
the cover portion is entirely made of a same material integrally.

(9) The light emitting apparatus according to (8), in which
the cover portion is made of glass or sapphire.

(10) The light emitting apparatus according to any one of (1) to (7), in which
the light transmission portion and the protrusion portion are made of materials different from each other.

(11) The light emitting apparatus according to (10), in which
the first side surface portion includes a through hole, a peripheral portion of the through hole, and a light transmission side member which includes the light transmission portion and is connected to the peripheral portion from an inner portion side of the cover portion in such a manner that the light transmission portion blocks the through hole from the inner portion side.

(12) The light emitting apparatus according to any one of (3) to (11), in which
the cover portion includes an upper surface portion which faces the support surface, and
the first side surface portion has a part connected with the upper surface portion, a cross sectional area of which is larger than a cross sectional area of a part connected with the support surface.

(13) The light emitting apparatus according to (12), in which
the cross sectional area of the first side surface portion is increased from the part connected with the support surface toward the part connected with the upper surface portion.

(14) The light emitting apparatus according to (12), in which
the first side surface portion has the part connected with the upper surface portion which has a curved shape.

REFERENCE SIGNS LIST 10 (10') base substrate
11 support surface
20 semiconductor laser
30 (30') glass cap
32, 232, 332, 432 front surface portion
34a, 34b side surface portion
40, 240, 440, 540 light transmission surface
41, 441, 541 protrusion portion
45 upper side
46 lower side
47a, 47b lateral side
48 upper side area
49a, 49b lateral side area
60 main surface portion
61 light transmission side member
100, 200, 300, 310, 400, 410, 500 light emitting apparatus
210 (210') cap member
212 through hole
215 peripheral portion
220 (220') glass member
250 groove
600 lead frame

The invention claimed is:

1. A light emitting apparatus, comprising:
a base portion that includes a support surface;
a light emitting element on the support surface of the base portion; and
a cover portion that includes:
  a plurality of side surface portions which surrounds the light emitting element;
  a light transmission portion through which light emitted from the light emitting element is to be transmitted, wherein
    the light transmission portion is on a first side surface portion of the plurality of side surface portions, and
    the first side surface portion includes a lower side connected with the support surface, an upper side opposite to the lower side, and two lateral sides between the lower side and the upper side; and
  a protrusion portion, wherein
    the protrusion portion is in contact with each of an upper side area and two lateral side areas,
    the upper side area is adjacent to the upper side,
    the two lateral side areas are adjacent to each of the upper side area and the two lateral sides, and
    the cover portion is on the support surface to cover the light emitting element.

2. The light emitting apparatus according to claim 1, wherein
the protrusion portion is protruded along a direction of transmission of the light emitted from the light emitting element.

3. The light emitting apparatus according to claim 1, wherein
the cover portion further includes an upper surface portion which faces the support surface,
the protrusion portion further includes an end portion of the upper surface portion on a side of the first side surface portion, and
the end portion is protruded relative to the light transmission portion.

4. The light emitting apparatus according to claim 1, wherein
the cover portion further includes two second side surface portions connected with the first side surface portion,
the protrusion portion further includes end portions of each of the two second side surface portions on a side of the first side surface portion, and
the end portions are protruded relative to the light transmission portion.

5. The light emitting apparatus according to claim 1, wherein
the cover portion is entirely made of a same material.

6. The light emitting apparatus according to claim 5, wherein
the cover portion comprises one of glass or sapphire.

7. The light emitting apparatus according to claim 1, wherein
the light transmission portion comprises a first material, and
the protrusion portion comprises a second material different from the first material.

8. The light emitting apparatus according to claim 7, wherein
the first side surface portion includes a through hole, a peripheral portion of the through hole, and a light transmission side member,
the light transmission side member includes the light transmission portion, and
the light transmission side member is connected to the peripheral portion from an inner portion side of the cover portion such that the light transmission portion blocks the through hole from the inner portion side.

9. The light emitting apparatus according to claim 1, wherein
the cover portion further includes an upper surface portion which faces the support surface, and
the first side surface portion has a first part connected with the upper surface portion, and
a first cross sectional area of the first part is larger than a second cross sectional area of a second part connected with the support surface.

10. The light emitting apparatus according to claim 9, wherein
the second cross sectional area is increased from the second part connected with the support surface towards the first part connected with the upper surface portion.

11. The light emitting apparatus according to claim 9, wherein
the first side surface portion has the first part connected with the upper surface portion, and
the first part has a curved shape.

12. A method of manufacturing a light emitting apparatus, comprising:
mounting a plurality of light emitting elements on a substrate;
forming a cover member having a plurality of surface portions, wherein the plurality of surface portions surrounds the plurality of light emitting elements,
forming, on a main surface portion of the plurality of surface portions, at least one light transmission side member including a light transmission portion through which light emitted from each of the plurality of light emitting elements is transmitted in accordance with positions of the plurality of light emitting elements, wherein
  the main surface portion includes a lower side connected with the substrate, an upper side opposite to the lower side, and two lateral sides between the lower side and the upper side;

bonding the substrate and the cover member such that the at least one light transmission side member is connected to a specific position with respect to the plurality of light emitting elements on the substrate, wherein a protrusion portion is in contact with each of an upper side area and two lateral side areas, the upper side area is adjacent to the upper side, and the two lateral side areas are adjacent to each of the upper side area and the two lateral sides;

cutting a position which is offset toward a direction in which the light is transmitted relative to the light transmission portion of the at least one light transmission side member on the main surface portion; and forming a plurality of light emitting apparatuses including the plurality of light emitting elements.

13. The method according to claim 12, further comprising forming each of the main surface portion and the at least one light transmission side member by a same material.

14. The method according to claim 12, further comprising connecting the at least one light transmission side member separated from the main surface portion with the main surface portion.

\* \* \* \* \*